(12) United States Patent
Li et al.

(10) Patent No.: US 11,682,620 B2
(45) Date of Patent: Jun. 20, 2023

(54) GRADED METALLIC LINER FOR METAL INTERCONNECT STRUCTURES AND METHODS FOR FORMING THE SAME

(71) Applicant: Taiwan Semiconductor Manufacturing Company Limited, Hsinchu (TW)

(72) Inventors: Shu-Wei Li, Hsinchu (TW); Guanyu Luo, Hsinchu (TW); Shin-Yi Yang, Taipei (TW); Ming-Han Lee, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 162 days.

(21) Appl. No.: 17/205,184

(22) Filed: Mar. 18, 2021

(65) Prior Publication Data

US 2022/0302039 A1  Sep. 22, 2022

(51) Int. Cl.
*H01L 23/532* (2006.01)
*H01L 23/522* (2006.01)
*H01L 21/321* (2006.01)
*H01L 21/768* (2006.01)

(52) U.S. Cl.
CPC .... *H01L 23/53209* (2013.01); *H01L 21/3212* (2013.01); *H01L 21/76802* (2013.01); *H01L 21/76843* (2013.01); *H01L 23/5226* (2013.01)

(58) Field of Classification Search
CPC .......... H01L 23/53209; H01L 21/3212; H01L 21/76802; H01L 21/76843; H01L 23/5226
See application file for complete search history.

(56) References Cited

U.S. PATENT DOCUMENTS 6,955,986 B2 * 10/2005 Li .................... H01L 21/28562
                                                               438/653
2018/0053727 A1 * 2/2018 Edelstein .......... H01L 21/28568

* cited by examiner

*Primary Examiner* — Karen Kusumakar
(74) *Attorney, Agent, or Firm* — The Marbury Law Group, PLLC

(57) ABSTRACT

A structure may include an interconnect-level dielectric layer containing a dielectric material and overlying a substrate, and a metal interconnect structure embedded in the interconnect-level dielectric layer and including a graded metallic alloy layer and a metallic fill material portion. The graded metallic alloy layer includes a graded metallic alloy of a first metallic material and a second metallic material. The atomic concentration of the second metallic material increases with a distance from an interface between the graded metallic alloy and the interconnect-level dielectric layer. The graded metallic alloy layer may be formed by simultaneous or cyclical deposition of the first metallic material and the second metallic material. The first metallic material may provide barrier property, and the second metallic material may provide adhesion property.

20 Claims, 15 Drawing Sheets

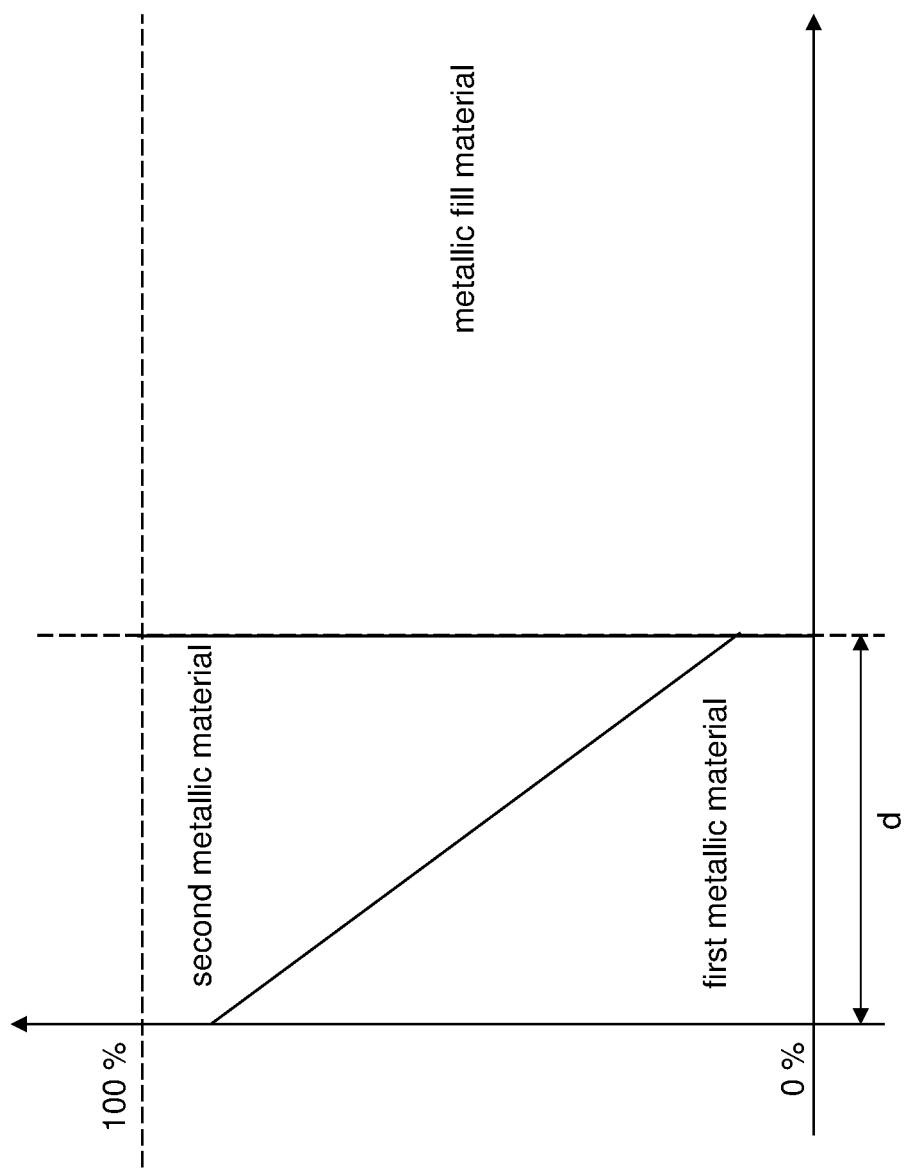

GRADED METALLIC LINER FOR METAL INTERCONNECT STRUCTURES AND METHODS FOR FORMING THE SAME

BACKGROUND

Metal interconnect structures are employed to provide electrical connection among semiconductor devices in a semiconductor chip. Structural integrity of the metal interconnect structures is necessary to provide a reliable semiconductor chip. In addition, consideration of the overall resistivity of the metal interconnect structures should be made to account for RC delays and significant voltage drops.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram illustrating material composition within a graded metallic alloy layer of embodiments of the present disclosure.

DETAILED DESCRIPTION

Figure 1:
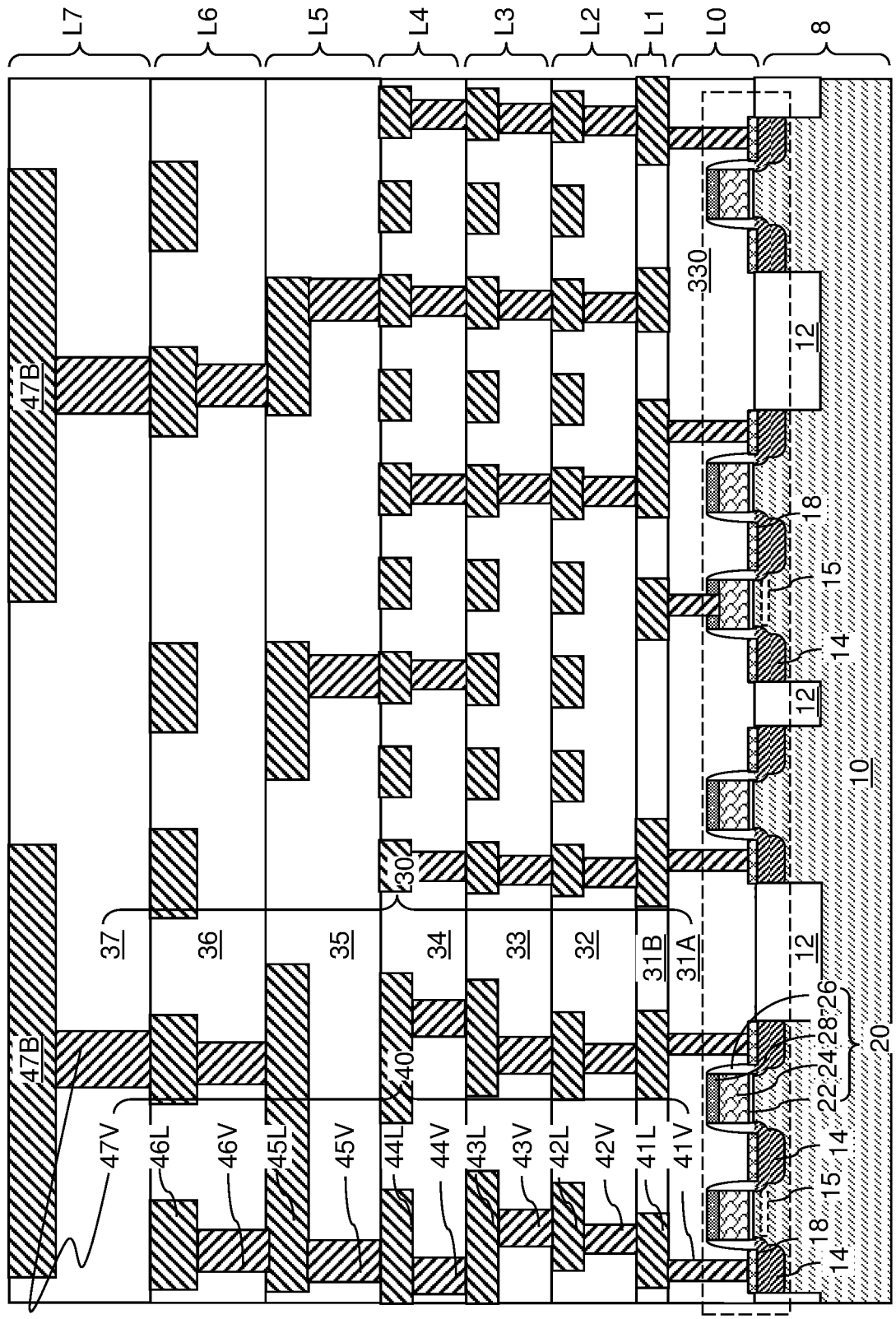
FIG. 1 is a vertical cross-sectional view of an exemplary structure including semiconductor devices and metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements have the same reference numeral are presumed to have the same material composition unless expressly described otherwise.

The present disclosure is directed to semiconductor devices, and specifically to metal interconnect structures including a graded metallic liner and methods of forming the same. By utilizing graded metallic liners, the width of metallic barrier layer and the adhesion layer may be reduced. Consequently, additional room for metallic fill materials may be provided.

A metal interconnect structure can include a metallic barrier layer and an adhesion layer before deposition of a high conductivity fill material portion. The metallic barrier layer has a thickness of about 3 nm and the adhesion layer has a thickness of about 3 nm. To provide space for the metallic barrier layer and adhesion layers, the lateral boundaries of a line cavity or a via cavity for depositing a high conductivity metal are reduced by 6 nm from each sidewall. Accordingly, the width of the high conductivity fill material portion is reduced by about 12 nm. As the minimum lateral dimension of metal interconnect structures decreases with scaling of metal interconnect structures, the volume percentage of the high conductivity metal portions relative to the total volume of the line cavity or the via cavity may decrease significantly due to the metallic barrier layer and the adhesion layer. The net effect is high effective electrical resistivity for metal interconnect structures having small lateral dimensions, which may result in long RC delays in signal transmission, and significant voltage drop within metal wiring structures.

Generally, the structures and methods of the present disclosure may be used to form metal interconnect structures in which the fractional volume of a metallic fill material is enhanced to provide overall high electrical conductivity. Rather than using a combination of a metallic barrier layer and a metallic adhesion layer, metal interconnect structures of embodiments of the present disclosure use a graded metallic material layer in which a first metallic material that provides diffusion barrier properties has a gradually decreasing atomic concentration as a function of a distance from an interface with an interconnect-level dielectric layer. A second metallic material within the graded metallic material layer has a gradually increasing atomic concentration as a function of the distance from the interface with the interconnect-level dielectric layer. The thickness of the graded metallic material layer within a metal interconnect structure of embodiments of the present disclosure may be less than the total thickness of a layer stack including a metallic barrier layer and a metallic adhesion layer. Thus, metal interconnect structures of embodiments of the present disclosure may comprise a higher fractional volume of metallic fill material that may provide higher electrical conductivity than metal interconnect structures according to conventional metal interconnect structures that have identical shapes and volumes.

Referring to FIG. 1, an exemplary structure according to an embodiment of the present disclosure is illustrated, which includes semiconductor devices 330 and metal interconnect structures 40. The exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include any semiconductor device known in the art, which may include field effect transistors, an array of memory cells, capacitors, inductors, antennas, and/or other passive devices.

For example, field effect transistors may be formed on, and/or in, the semiconductor material layer 10. In such an embodiment, shallow trench isolation structures 12 may be formed in an upper portion of the semiconductor material layer 10 by forming shallow trenches and subsequently filling the shallow trenches with a dielectric material such as silicon oxide. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a dielectric gate cap 28. The vertical stack is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed using the gate structures 20 as self-aligned implantation masks to form deep active regions 14, which may include deep source regions and deep drain regions. Upper portions of the deep active regions 14 (i.e., source and drain regions) may overlap with portions of the extension implantation regions. Each combination of an extension implantation region and a deep active region constitutes an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 (i.e., which may include metal silicides) may be formed on the top surface of each active region 14 (i.e., source regions and drain regions). Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the semiconductor material layer 10, which may include a periphery circuit for the array(s) of resistive memory elements to be subsequently formed.

Various interconnect-level structures (L0, L1, L2, L3, L4, L5, L6, L7) may be subsequently formed. In an illustrative example, the interconnect-level structures (L0, L1, L2, L3, L4, L5, L6, L7) may include a contact-level structure L0, a first interconnect-level structure L1, and a second interconnect-level structure L2, a third interconnect-level structure L3, a fourth interconnect-level structure L4, a fifth interconnect-level structure L5, a sixth interconnect-level structure L6, and a seventh interconnect-level structure L7. While the present disclosure is described using an embodiment in which eight levels of interconnect-level structures (L0, L1, L2, L3, L4, L5, L6, L7) are used, embodiments are expressly contemplated herein in which the total number of levels in the interconnect-level structures (L0, L1, L2, L3, L4, L5, L6, L7) is 1 or any integer greater than 1.

The contact-level structure L0 may include a planarization dielectric layer 31A including a planarizable dielectric material such as silicon oxide and various contact via structures 41V contacting a respective one of the active regions 14 or the gate electrodes 24 and embedded within the planarization dielectric layer 31A. The first interconnect-level structure L1 includes a first interconnect-level dielectric layer 31B and first metal lines 41L embedded within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 includes a second interconnect-level dielectric layer 32, which may include a stack of a first via-level dielectric material layer and a second line-level dielectric material layer, or a line-and-via-level dielectric material layer. The second interconnect-level dielectric layer 32 embeds second interconnect-level metal interconnect structures (42V, 42L), which includes first metallic via structures 42V and second metal lines 42L. Top surfaces of the second metal lines 42L may be coplanar with the top surface of the second interconnect-level dielectric layer 32.

The third interconnect-level structure L3 includes a third interconnect-level dielectric layer 33, which may include a stack of a second via-level dielectric material layer and a third line-level dielectric material layer, or a line-and-via-level dielectric material layer. The third interconnect-level dielectric layer 33 embeds third interconnect-level metal interconnect structures (43V, 43L), which includes second metallic via structures 43V and third metal lines 43L. Top surfaces of the third metal lines 43L may be coplanar with the top surface of the third interconnect-level dielectric layer 33.

The fourth interconnect-level structure L4 may include a fourth interconnect-level dielectric layer 34 embedding fourth interconnect-level metal interconnect structures (44V, 44L), which may include third metallic via structures 44V and fourth metal lines 44L. The fifth interconnect-level structure L5 may include a fifth interconnect-level dielectric layer 35 embedding fifth interconnect-level metal interconnect structures (45V, 45L), which may include fourth metallic via structures 45V and fifth metal lines 45L. The sixth interconnect-level structure L6 may include a sixth interconnect-level dielectric layer 36 embedding sixth interconnect-level metal interconnect structures (46V, 46L), which may include fifth metallic via structures 46V and sixth metal lines 46L. The seventh interconnect-level structure L7 may include a seventh interconnect-level dielectric layer 37 embedding sixth metallic via structures 47V (which are seventh interconnect-level metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each combination of a metallic via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers (not expressly shown) and dielectric capping layers (not expressly shown) may be inserted between vertically neighboring pairs of ILD layers 30, or may be incorporated into one or more of the ILD layers 30.

Figure 2A:
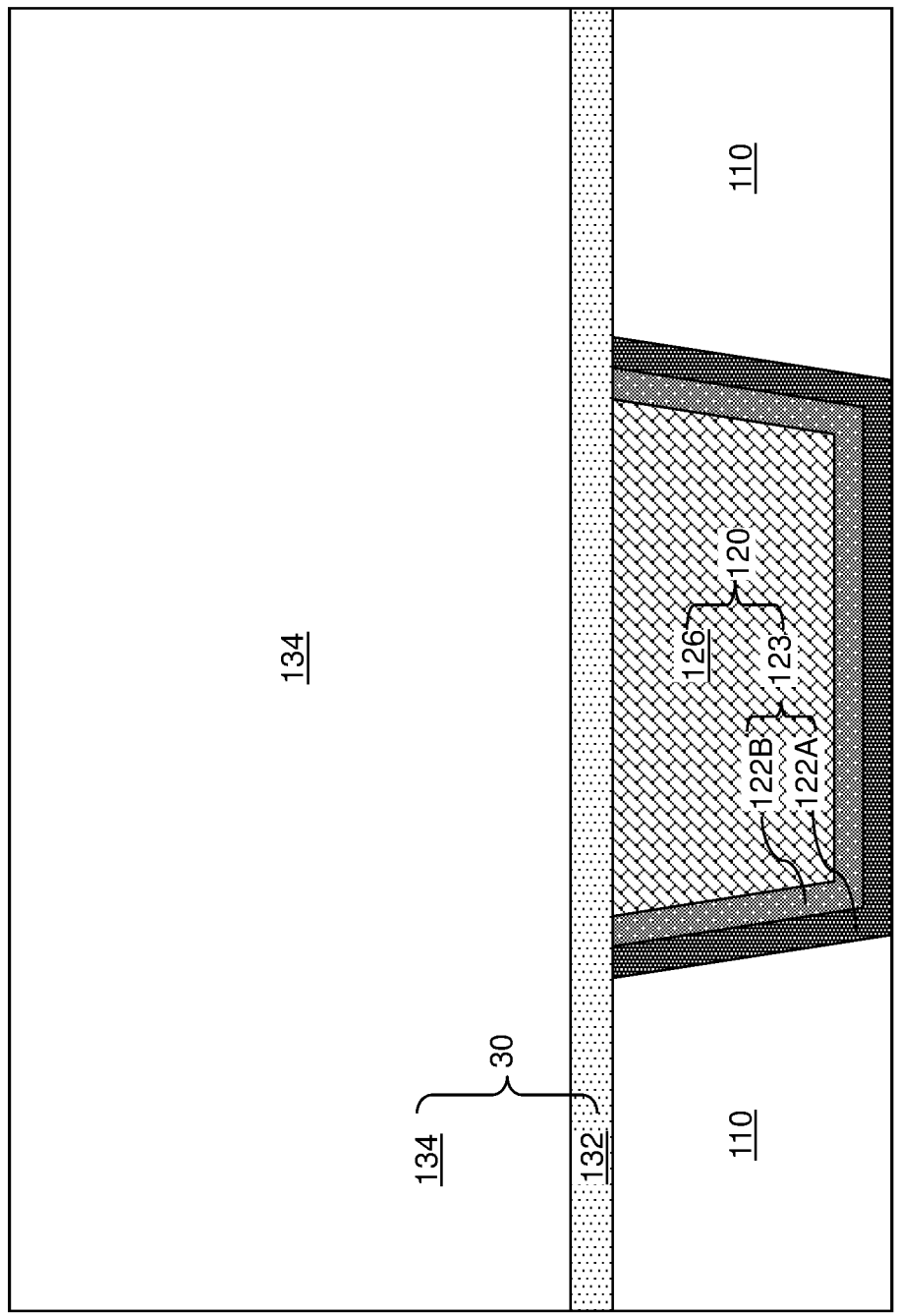
FIG. 2A is vertical cross-sectional view of a portion of the exemplary structure after formation of an underlying conductive material portion, an etch stop dielectric layer, and a line-and-via-level dielectric material layer according to an embodiment of the present disclosure.

Referring to FIG. 2A, a portion of the exemplary structure of FIG. 1 having a first configuration is illustrated during a manufacturing step. The illustrated portion of FIG. 2A includes an interconnect-level dielectric layer 30, which may be any one of the interconnect-level dielectric layers (e.g., 31A-37) illustrated in FIG. 1. In one embodiment, the illustrated interconnect-level dielectric layer 30 may be a line-and-via-level dielectric layer in which metallic via structures and metallic line structures may be subsequently formed. The illustrated interconnect-level dielectric layer 30 may include a dielectric material layer 134 that includes an interconnect-level dielectric (ILD) material such as undoped silicate glass, a doped silicate glass, non-porous organosilicate glass (a SiCOH dielectric), or a porous organosilicate glass. In one embodiment, the dielectric material layer 134 may include, and/or may comprise a porous dielectric material having a dielectric constant in a range from 1.4 to 3.9. The thickness of the dielectric material layer 134 may be in a range from 3 nm to 300 nm, such as from 10 nm to 100 nm, although lesser and greater thicknesses may also be used. Optionally, the interconnect-level dielectric layer 30 may include an etch stop dielectric layer 132, which may be formed prior to formation of the dielectric material layer 134. The etch stop dielectric layer 132 may include a dielectric material providing higher etch resistance than the dielectric material layer 134 during an anisotropic etch process. For example, the etch stop dielectric layer 132 may include silicon carbide nitride, silicon oxynitride, or silicon nitride. Other suitable etch stop dielectric layer materials are within the contemplated scope of disclosure. The thickness of the etch stop dielectric layer 132 may be in a range from 1 nm to 30 nm, such as from 2 nm to 6 nm, although lesser and greater thicknesses may also be used.

An underlying conductive material portion 120 is also illustrated, which underlies the interconnect-level dielectric layer 30. The underlying conductive material portion 120 may be formed within an underlying matrix layer 110. In one embodiment, the underlying conductive material portion 120 may be any one of the metal interconnect structures 40 other than the topmost metal interconnect structures, i.e., any metal interconnect structure 40 other than the metal bonding pads 47B. In one embodiment, the underlying conductive material portion 120 may be a metallic via structure, a metallic line structure, or an integrated metallic line and via structure. In such an embodiment, the underlying matrix layer 110 may be another interconnect-level dielectric layer 30 that underlies the overlying interconnect-level dielectric layer 30. Alternatively, the underlying conductive material portion 120 may be a conductive component (i.e., a node) of a semiconductor device such as a metal-semiconductor alloy region 18 or an active region 14 (such as a source region or a drain region) of a field effect transistor, or a gate electrode 24 of a field effect transistor. In such an embodiment, the underlying matrix layer 110 may be the matrix material layer that laterally surrounds the conductive component such as a semiconductor material layer 10 and/or a shallow trench isolation structure 12, or a dielectric gate spacer 26 and/or a bottommost one of the interconnect-level dielectric layers 30 that laterally surrounds the gate electrode 24. Generally, a semiconductor device may be formed on the substrate 8, and the conductive material portion 120 may comprise a node of the semiconductor device or an additional metal interconnect structure 40 overlying the substrate 8 and electrically connected to the node of the semiconductor device.

In an illustrative example, in embodiments in which the underlying conductive material portion 120 comprises a metallic via structure, a metallic line structure, or an integrated metallic line and via structure, the underlying conductive material portion 120 may include a layer stack 123 of a metallic barrier layer 122A and a metallic adhesion layer 122B, and a metal fill material portion 126. In some embodiments, the metallic barrier layer 122A may include, and/or may comprise a conductive metallic nitride material such as TiN, TaN, or WN, the metallic adhesion layer 122B may include, and/or may comprise a metallic adhesion material such as Co, Ru, Mn, Zn, Zr, Ni, Ta, Hf, Nb, V, W, and alloys thereof, and the metal fill material portion 126 may be a metal fill material portion including Cu, Co, Ru, Mo, W, Al, or an alloy thereof. Other suitable materials are within the contemplated scope of disclosure.

Figure 2B:
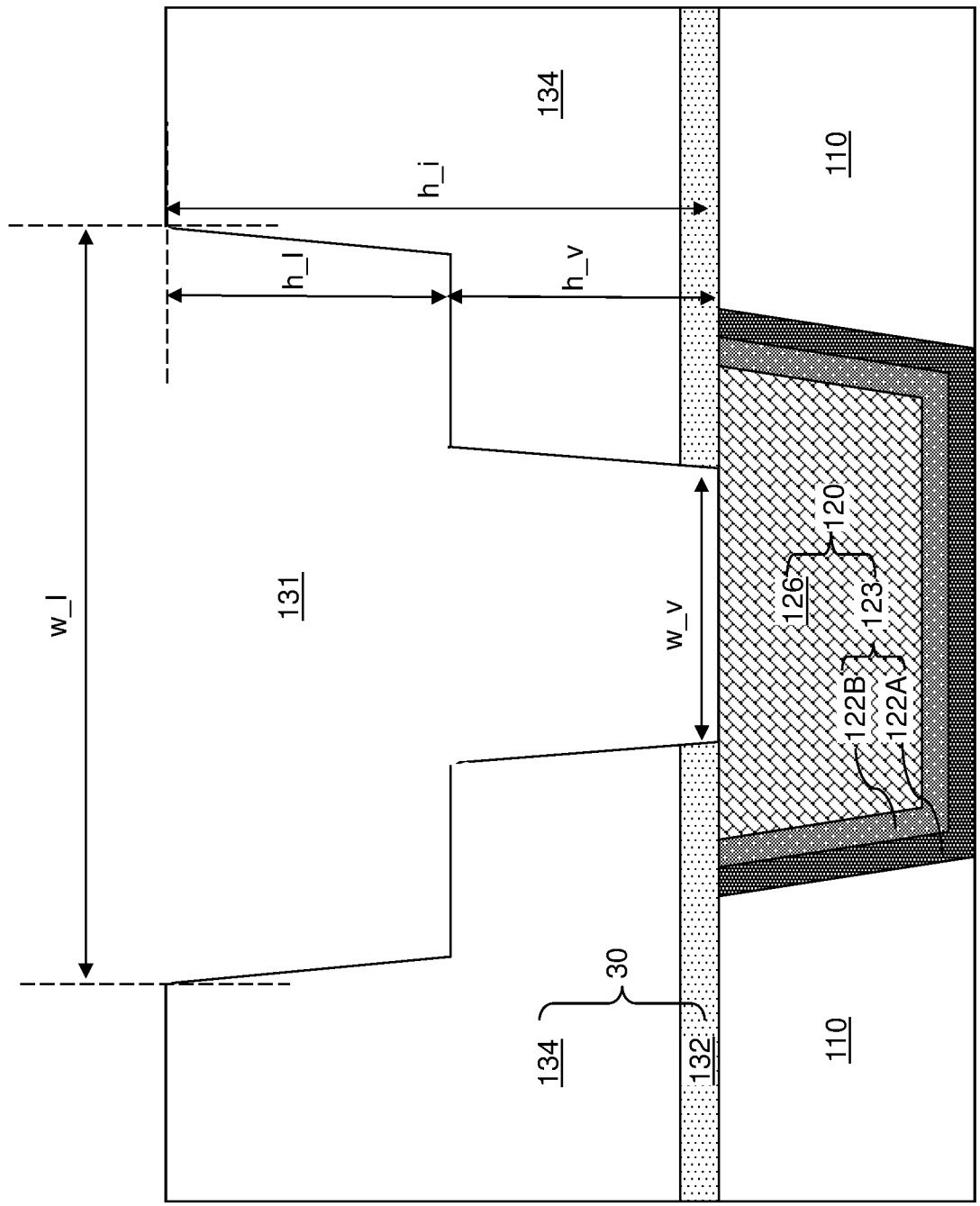
FIG. 2B is vertical cross-sectional view of the portion of the exemplary structure after formation of an integrated line and via cavity according to an embodiment of the present disclosure.

Referring to FIG. 2B, integrated line and via cavities 131 may be formed though the interconnect-level dielectric layer 30. While only a single integrated line and via cavity 131 is illustrated in FIG. 2B, it is understood that a plurality of integrated line and via cavities 131 may be simultaneously formed through the interconnect-level dielectric layer 30. The integrated line and via cavities 131 may be formed using a via-first-line-last integration scheme or a line-first-via-last integration scheme.

In embodiments in which a via-first-line-last integration scheme is used, a first photoresist layer (not shown) may be applied over the top surface of the interconnect-level dielectric layer 30. The first photoresist layer may be lithographically patterned to form openings having a pattern of via cavities to be subsequently formed in a lower portion of the interconnect-level dielectric layer 30. A first anisotropic etch process may be performed to etch through unmasked regions of the upper portion of the interconnect-level dielectric layer 30. The pattern of the openings in the first photoresist layer may be transferred through the upper portion of the interconnect-level dielectric layer 30. The bottom surfaces of the via cavities in the interconnect-level dielectric layer 30 may be formed at a height located in a range from 10% to 80%, such as from 20% to 80%, of the height of the interconnect-level dielectric layer 30 from the horizontal plane including the bottom surface of the interconnect-level dielectric layer 30. The first photoresist layer may be subsequently removed, for example, by ashing.

A second photoresist layer (not shown) may be applied over the top surface of the interconnect-level dielectric layer 30. The second photoresist layer may be lithographically patterned to form openings having a pattern of line cavities to be subsequently formed in an upper portion of the interconnect-level dielectric layer 30. The areas of the pattern of the line cavities may include the areas of the pattern of the via cavities. A second anisotropic etch process may be performed to etch through unmasked regions of the upper portion of the interconnect-level dielectric layer 30, and to extend the depth of the via cavities to the bottom surface of the interconnect-level dielectric layer 30. Line cavities may be formed though the upper portion of in the interconnect-level dielectric layer 30. The height of the horizontal bottom surfaces of the line cavities as measured from the horizontal plane including the bottom surface of the interconnect-level dielectric layer 30 may be in a range from 25% to 75%, such as from 40% to 60%, of the height of the interconnect-level dielectric layer 30. The second photoresist layer may be subsequently removed, for example, by ashing.

In embodiments in which a line-first-via-last integration scheme is used, a first photoresist layer (not shown) may be applied over the top surface of the interconnect-level dielectric layer 30. The first photoresist layer may be lithographically patterned to form openings having a pattern of line cavities to be subsequently formed in an upper portion of the interconnect-level dielectric layer 30. A first anisotropic etch process may be performed to etch through unmasked regions of the upper portion of the interconnect-level dielectric layer 30. The pattern of the openings in the first photoresist layer is transferred through the upper portion of the interconnect-level dielectric layer 30. The bottom surfaces of the line cavities in the interconnect-level dielectric layer 30 may be formed at a height located in a range from 10% to 80%, such as from 20% to 80%, of the height of the interconnect-level dielectric layer 30 from the horizontal plane including the bottom surface of the interconnect-level dielectric layer 30. The first photoresist layer may be subsequently removed, for example, by ashing.

A second photoresist layer (not shown) may be applied over the top surface of the interconnect-level dielectric layer 30. The second photoresist layer may be lithographically patterned to form openings having a pattern of via cavities to be subsequently formed in a lower portion of the interconnect-level dielectric layer 30. The area of the pattern of the via cavities may be located entirely within the areas of the pattern of the line cavities. A second anisotropic etch process may be performed to etch through unmasked regions of the lower portion of the interconnect-level dielectric layer 30, thereby forming via cavities vertically extending from bottom surfaces of the line cavities to the bottom surface of the interconnect-level dielectric layer 30. Via cavities are formed though the lower portion of in the interconnect-level dielectric layer 30. The height of the via cavities may be in a range from 25% to 75%, such as from 40% to 60%, of the height of the interconnect-level dielectric layer 30. The second photoresist layer may be subsequently removed, for example, by ashing.

The height $h\_1$ of a line cavity portion of each line and via cavity 131 may be in a range from 2 nm to 150 nm, such as from 6 nm to 50 nm, although lesser and greater thicknesses may also be employed. The height $h\_v$ of a via cavity portion of each line and via cavity 131 may be in a range from 1 nm to 150 nm, such as from 3 nm to 50 nm, although lesser and greater thicknesses may also be used. The total height $h\_i$ of the integrated line and via cavity 131 may be in a range from 3 nm to 300 nm, such as from 10 nm to 100 nm, although lesser and greater heights may also be used. The width $w\_v$ of each bottom surface of a via cavity portion of the integrated line and via cavities 131 may be in a range from 1 nm to 100 nm, such as from 3 nm to 30 nm, although lesser and greater widths may also be used for each via cavity portion. The width $w\_1$ of the line cavity portion of an integrated line and via cavity 131 as measured along a narrow direction of the line cavity portion may be in a range from 35 nm to 300 nm, although lesser and greater widths may also be used for each line cavity portion. The aspect ratio of the integrated line and via cavity 131, as calculated by the ratio of the width $w\_1$ of the line cavity portion of an integrated line and via cavity 131 to the width $w\_v$ of the via cavity portion of the integrated line and via cavity 131, may be in a range from 1 to 35. The angle of each sidewall of the line cavity portions and the via cavity portions of the integrated line and via cavities 131 may be in a range from 0 degree to 75 degree, such as from 1 degree to 10 degrees, with respect to the vertical direction, which is the direction that is perpendicular to the top surface of the substrate 8.

Figure 2C:
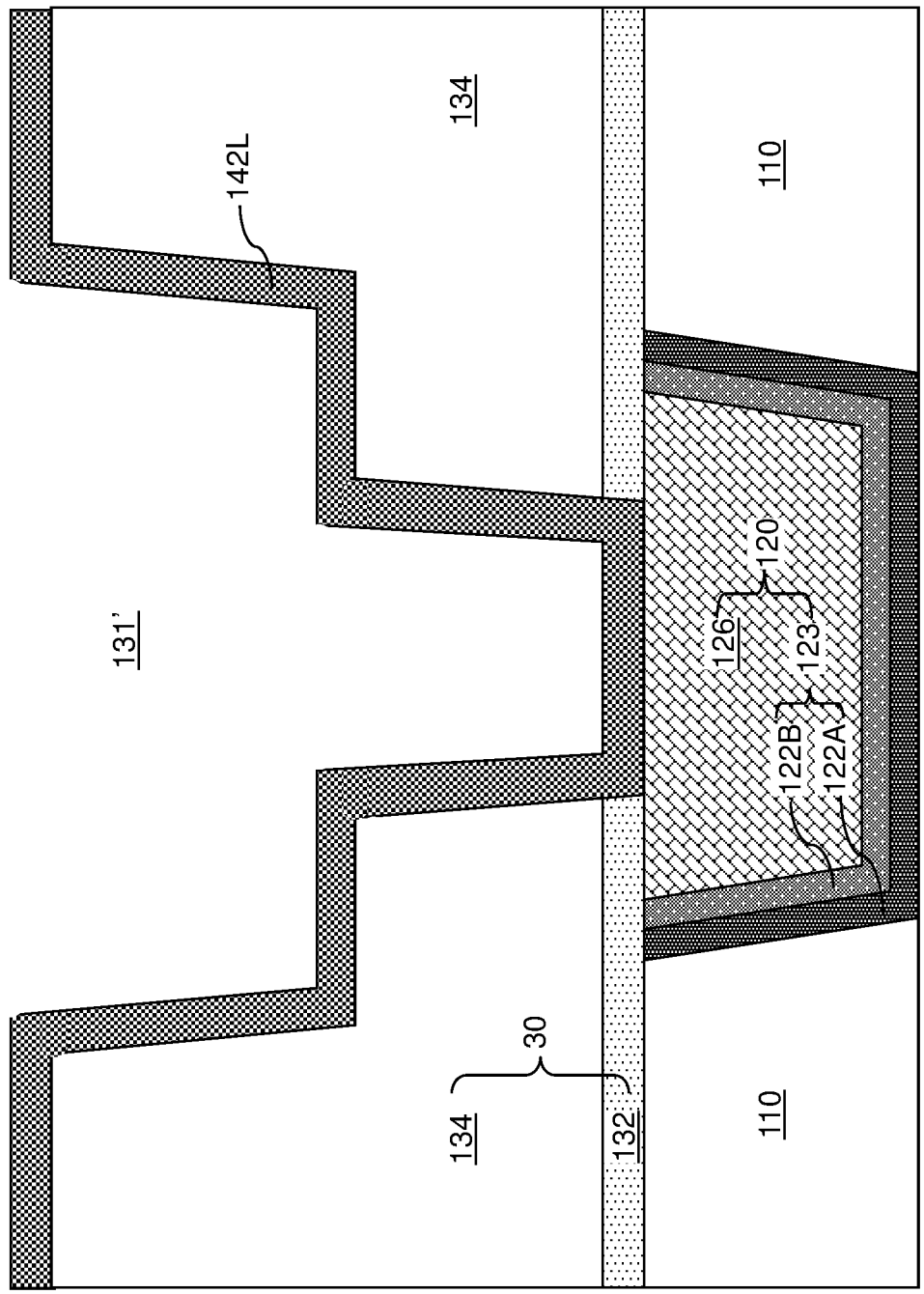
FIG. 2C is vertical cross-sectional view of the portion of the exemplary structure after formation of a graded metallic alloy layer according to an embodiment of the present disclosure.

Referring to FIG. 2C, a graded metallic alloy layer 142L including a graded metallic alloy of a first metallic material and a second metallic material may be deposited on the physically exposed surfaces of each integrated line and via cavity 131. The graded metallic alloy layer 142L may include an intermetallic alloy of the first metallic material and the second metallic material in a same phase, or may include a mixture of the first metallic material in a first phase and the second metallic material in a second phase. The graded metallic alloy layer 142L may be formed as a continuous material layer, and may, or may not, be conformal depending on the deposition method used to form the graded metallic alloy layer 142L. In such an embodiment, the graded metallic alloy layer 142L has different thicknesses on sidewalls and over horizontal surfaces, all references to thicknesses and distances within the graded metallic alloy layer 142L refer to thicknesses of a vertically extending portion of the graded metallic alloy layer 142L located on a sidewall of an integrated line and via cavity 131 that adjoins the top surface of the interconnect-level dielectric layer 30.

The second metallic material may be different from the first metallic material. In one embodiment, the first metallic material and the second metallic material may be selected such that adhesion strength between the second metallic material and a metallic fill material to be subsequently deposited on the physically exposed surfaces of the graded metallic alloy layer 142L is greater than adhesion strength between the first metallic material and the metallic fill material. Further, the first metallic material and the second metallic material may be selected such that the first metallic material provides greater diffusion blocking property for the metallic fill material than the second metallic material provides diffusion blocking property for the metallic fill material to be subsequently deposited.

The graded metallic alloy layer 142L may be deposited on all surfaces of each integrated line and via cavity 131 as well as over the top surface of the interconnect-level dielectric layer 30 (i.e., dielectric material layer 134). The graded metallic alloy layer 142L may have a graded metallic composition such that the atomic concentration of the second metallic material increases with a distance from an interface between the graded metallic alloy and the interconnect-level dielectric layer 30 within the graded metallic alloy. In embodiments in which the first metallic material includes a single first elemental metal, the atomic concentration of the first metallic material refers to the atomic concentration of the single first elemental metal. In embodiments in which the first metallic material includes a plurality of first elemental metals, the atomic concentration of the first metallic material refers to the sum of all atomic concentrations of the plurality of first elemental metals. Likewise, in embodiments in which the second metallic material includes a single second elemental metal, the atomic concentration of the second metallic material refers to the atomic concentration of the single second elemental metal. In embodiments in which the second metallic material includes a plurality of second elemental metals, the atomic concentration of the second metallic material refers to the sum of all atomic concentrations of the plurality of second elemental metals.

In one embodiment, the graded metallic alloy layer 142L may comprise the graded metallic alloy of the first metallic material and the second metallic material. In one embodiment, the first metallic material may comprise at least one first elemental metal, and the second metallic material may comprise at least one second elemental metal that is different from the first metallic material. In other words, each of the first metallic material and the second metallic material may comprise a respective set of at least one elemental metal. As such, the graded metallic alloy layer 142L may be substantially free of any non-metallic element such as nitrogen, oxygen, and carbon. In one embodiment, the graded metallic alloy layer 142L comprises, and/or consists essentially of, an intermetallic alloy of the at least one first elemental metal and the at least one second elemental metal, and is essentially free of any non-metallic material. For example, the graded metallic alloy layer 142L may consist essentially of metallic elements, and may be free of non-metallic elements. In one embodiment, the graded metallic alloy layer 142L may be essentially free of nitrogen atoms. For example, the atomic concentration of nitrogen atoms in the graded metallic alloy layer 142L may be less than $5.0\times10^{16}/cm^3$, and may be less than $1.0\times10^{15}/cm^3$. In one embodiment, the at least one first elemental metal in the first metallic material and at least one second elemental metal in the second metallic material may be mutually exclusive. In other words, the first metallic material may not include any element of the second metallic material, and vice versa.

In one embodiment, each of the at least one first elemental metal may be selected from Ta, Ti, Ru, In, Zn, Mn, Zr, W, Mo, Os, Ir, Al, Fe, and Ni, and each of the at least one second elemental metal may be selected from Co, Ru, Mn, Zn, Zr, W, Mo, Os, Ir, Al, Fe, and Ni. In one embodiment, the first metallic material may comprise one of more first metals selected from Ta, Ti, Ru, In, Zn, Mn, Zr, W, Mo, Os, Ir, Al, Fe, and Ni, and the second metallic material may comprise one or more of second metals selected from Co, Ru, Mn, Zn, Zr, W, Mo, Os, Ir, Al, Fe, and Ni. In one embodiment, the first metallic material may comprise one of more first metals selected from Ta and Ti, and the second metallic material may comprise one or more of second metals selected from Co and Ru. For example, the graded metallic alloy layer 142L can include a graded alloy of Ta and Co, a graded alloy of Ta and Ru, a graded alloy of Ti and Co, or a graded alloy of Ti and Ru. In one embodiment, the at least one first elemental metal is a first single elemental metal, and the at least one second elemental metal is a second single elemental metal. In one embodiment, the graded metallic alloy layer 142L can include an intermetallic alloy that consists essentially of a binary alloy of the first single elemental metal and the second single elemental metal.

In another embodiment, the at least one first elemental metal is a first single elemental metal, and the at least one second elemental metal is a plurality of single elemental metals. In yet another embodiment, the at least one first elemental metal is a plurality of first elemental metals, and the at least one second elemental metal is a single elemental metals. In still another embodiment, the at least one first elemental metal is a plurality of first elemental metals, and the at least one second elemental metal is a plurality of single elemental metals.

In one embodiment, the graded metallic alloy layer 142L may have a thickness in a range from 0.3 nm to 5 nm, such as from 0.6 nm to 2.5 nm. The atomic concentration of the second metallic material may be in a range from 5% to 30% at a first surface of the graded metallic alloy layer 142L that contacts the interconnect-level dielectric layer 30. The atomic concentration of the second metallic material may be in a range from 70% to 95% at the physically exposed surfaces of the graded metallic alloy layer 142L.

In one embodiment, the graded metallic alloy may be deposited by simultaneous physical vapor deposition of the first metallic material and the second metallic material with an increase over time of a sputter rate of the second metallic material. In another embodiment, the graded metallic alloy may be deposited by simultaneous physical vapor deposition of the first metallic material and the second metallic material with a decrease over time of a sputter rate of the first metallic material. The increase of the sputter rate of the second metallic material over time, or the decrease of the sputter rate of the first metallic material over time induces the compositional gradient within the graded metallic alloy layer 142L.

Alternatively, the graded metallic alloy may be deposited by cyclical physical vapor deposition of the first metallic material and the second metallic material within an increase over time of a duration of a sputter time per cycle for the second metallic material, or a decrease over time of a duration of a sputter time per cycle for the first metallic material. The increase of the duration of the sputter time per cycle for the second metallic material over time, or the decrease of the duration of the sputter time per cycle for the first metallic material over time induces the compositional gradient within the graded metallic alloy layer 142L.

In one embodiment, the graded metallic alloy may be deposited by simultaneous chemical vapor deposition or simultaneous atomic layer deposition of the first metallic material and the second metallic material with an increase over time of a deposition rate of the second metallic material. In another embodiment, the graded metallic alloy may be deposited by simultaneous chemical vapor deposition or simultaneous atomic layer deposition of the first metallic material and the second metallic material with a decrease over time of a deposition rate of the first metallic material. The increase of the deposition rate of the second metallic material over time, or the decrease of the deposition rate of the first metallic material over time induces the compositional gradient within the graded metallic alloy layer 142L.

Alternatively, the graded metallic alloy may be deposited by cyclical chemical vapor deposition or cyclical atomic layer deposition of the first metallic material and the second metallic material within an increase over time of a duration of a deposition time per cycle for the second metallic material, or a decrease over time of a duration of a deposition time per cycle for the first metallic material. The increase of the duration of the deposition time per cycle for the second metallic material over time, or the decrease of the duration of the deposition time per cycle for the first metallic material over time induces the compositional gradient within the graded metallic alloy layer 142L.

In one embodiment, the graded metallic alloy may be deposited by cyclical electrochemical deposition or cyclical electroless deposition of the first metallic material and the second metallic material with an increase over time of a duration of a deposition time per cycle for the second metallic material. In another embodiment, the graded metallic alloy may be deposited by cyclical electrochemical deposition or cyclical electroless deposition of the first metallic material and the second metallic material with a decrease over time of a duration of a deposition time per cycle for the first metallic material. The increase of the duration of the deposition time per cycle for the second metallic material over time, or the decrease of the duration of the deposition time per cycle for the first metallic material over time induces the compositional gradient within the graded metallic alloy layer 142L. Each line and via cavity 131 includes a void 131' after formation of the graded metallic alloy layer 142L. In other word, the void 132' is an unfilled volume of a respective line and via cavity 131.

Figure 2D:
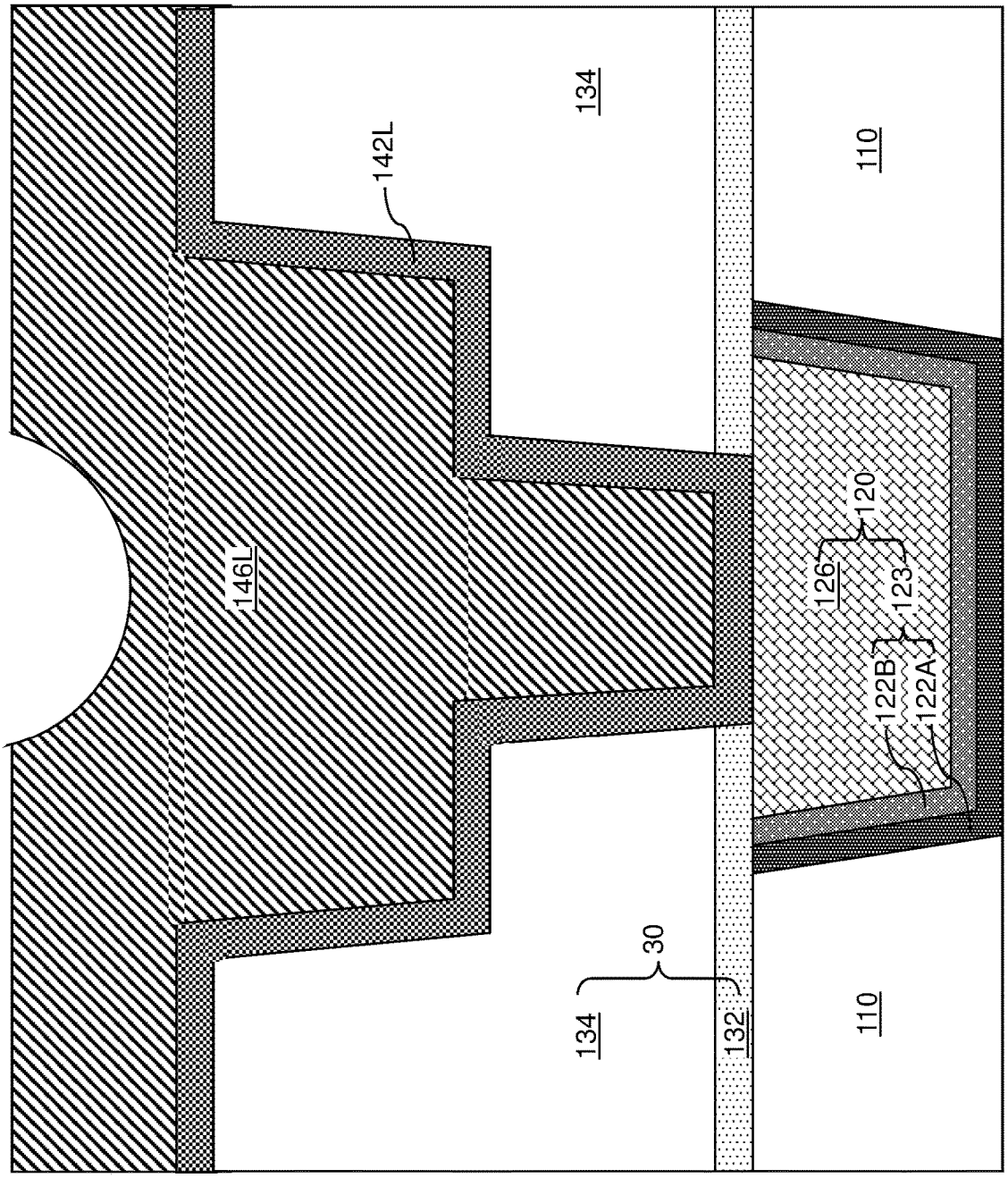
FIG. 2D is vertical cross-sectional view of the portion of the exemplary structure after formation of a metallic fill material layer according to an embodiment of the present disclosure.

Referring to FIG. 2D, a metallic fill material layer 146L may be deposited on the graded metallic alloy layer 142L. The metallic fill material layer 146L includes a high conductivity metal such as Cu, Co, W, Ru, and Mo or comprises CoWP, which is an electroplatable compound material including Co, W, and P. Other suitable metallic fill materials are within the contemplated scope of this disclosure. For example, the metallic fill material layer 146L may comprise an elemental metal selected from Cu, Co, W, Ru, and Mo or comprises CoWP. The metallic fill material layer 146L may be deposited by physical vapor deposition, chemical vapor deposition, electrochemical deposition, electroless deposition, or a combination thereof. For example, if the metallic fill material layer 146L comprises copper, the metallic fill material layer 146L may be deposited by a physical vapor deposition that anisotropically deposits a copper seed layer and by a subsequent electrochemical deposition that electroplates copper on the copper seed layer. The thickness of the metallic fill material layer (as measured over the horizontal top surface of the interconnect-level dielectric layer 30) may be selected such that the entire volume of each void 131' in the integrated line and via cavities 131 is filled with the metallic fill material layer 146L. In one embodiment, the metallic fill material layer 146L contacts each physically exposed surface of the graded metallic alloy layer 142L.

Figure 2E:
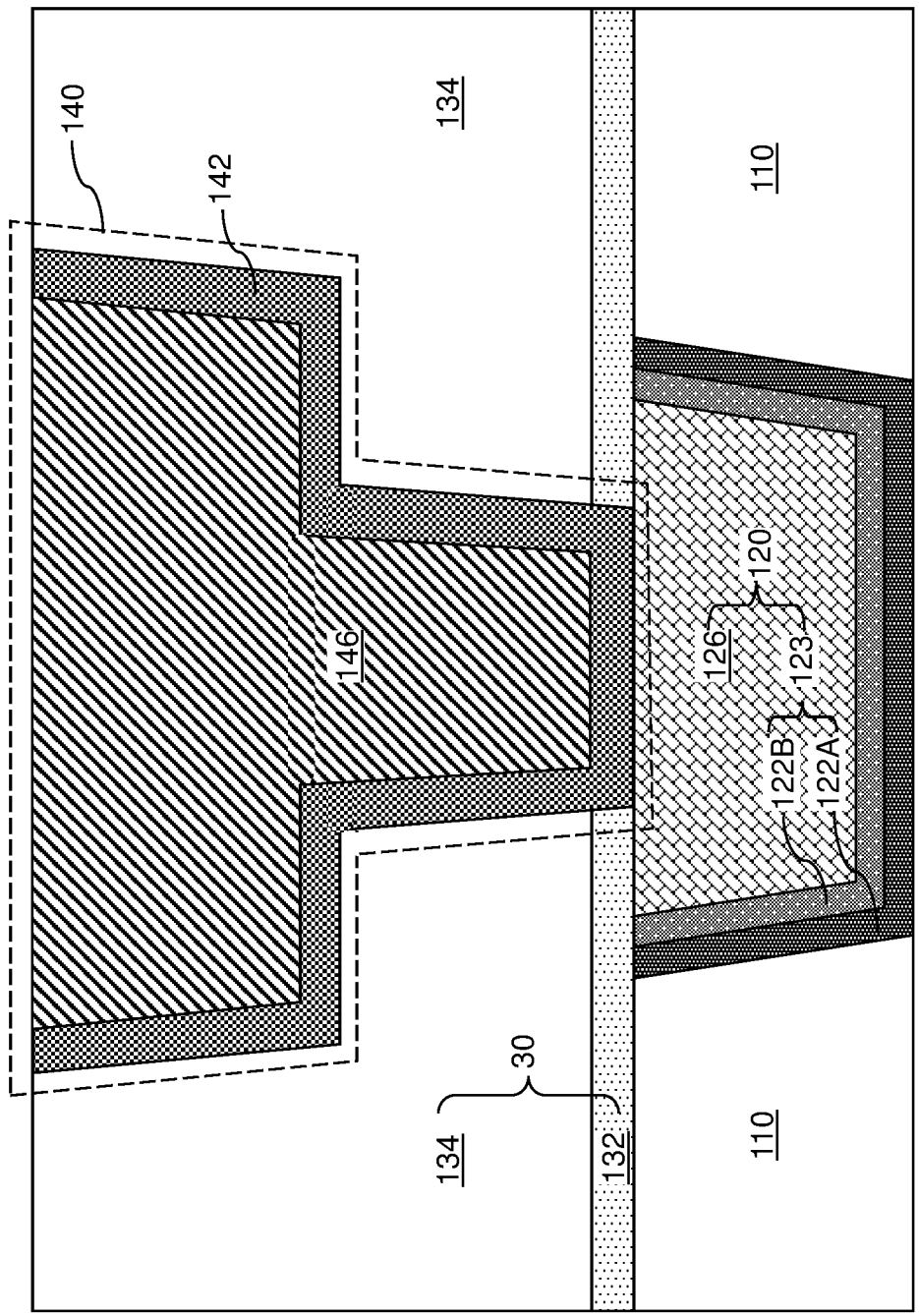
FIG. 2E is vertical cross-sectional view of the portion of the exemplary structure after formation of an integrated metallic line and via structure according to an embodiment of the present disclosure.

Referring to FIG. 2E, a planarization process may be performed to remove portions of the metallic fill material layer 146L and the graded metallic alloy layer 142L located above the interconnect-level dielectric layer 30. Specifically, the planarization process removes portions of the metallic fill material layer 146L and the graded metallic alloy layer 142L that are located above the horizontal plane including the top surface of the interconnect-level dielectric layer 30. The planarization process may include a chemical mechanical planarization (CMP) process.

Each set of metallic material portions that fills an integrated line and via cavity 131 constitutes a metal interconnect structure, which is herein referred to as an integrated metallic line and via structure 140. Each integrated metallic line and via structure 140 comprises a graded metallic alloy layer 142, which is a remaining portion of the graded metallic alloy layer 142L as formed at the processing steps of FIG. 2C. Further, each integrated metallic line and via structure 140 comprises a remaining portion of the metallic fill material of the metallic fill material layer 146L, which is herein referred to as a metallic fill material portion 146. The metallic fill material portion 146 contacts an inner sidewall of a vertically-extending portion of the graded metallic alloy layer 142 within a same integrated metallic line and via structure 140, and contacts a top surface of a horizontally-extending portion of the graded metallic alloy layer 142 within the same integrated metallic line and via structure 140. The top surface of each integrated metallic line and via structure 140 may be within a same horizontal plane as the top surface of the interconnect-level dielectric layer 30.

Figure 2F:
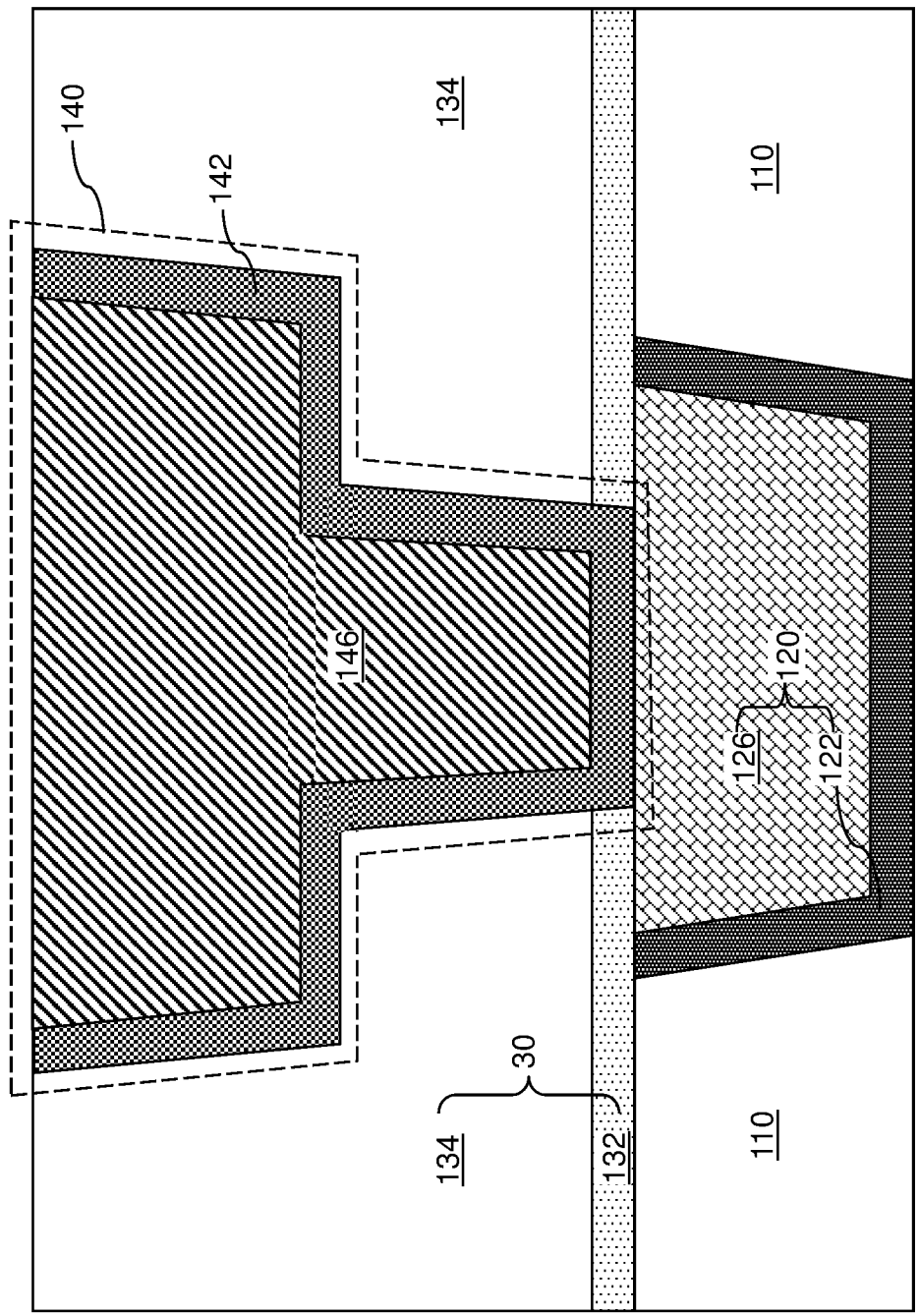
FIG. 2F is vertical cross-sectional view of an alternative configuration of the portion of the exemplary structure after formation of an integrated metallic line and via structure according to an embodiment of the present disclosure.

Referring to FIG. 2F, an alternative configuration of the exemplary structure may be derived from the exemplary structure of FIG. 2E by replacing the combination of a layer stack 123 of a metallic barrier layer 122A and a metallic adhesion layer 122B in the underlying conductive material portion 120 with an underlying graded metallic alloy layer 122. The underlying graded metallic alloy layer 122 may have the same thickness as, and the same material composition as, any configuration for the graded metallic alloy layer 142 as described above. In such an embodiment, the metal fill material portion 126 may have any material composition that the metallic fill material portion 146 may have as described above. The underlying conductive material portion 120 may comprise a metallic line structure, a metallic via structure, or an integrated metallic line and via structure.

Each configuration for the integrated metallic line and via structure 140 may be used as a combination of a metal line and at least one metallic via structure or as a combination of a metallic bonding pad and at least one metallic via structure illustrated in FIG. 1.

Figure 3A:
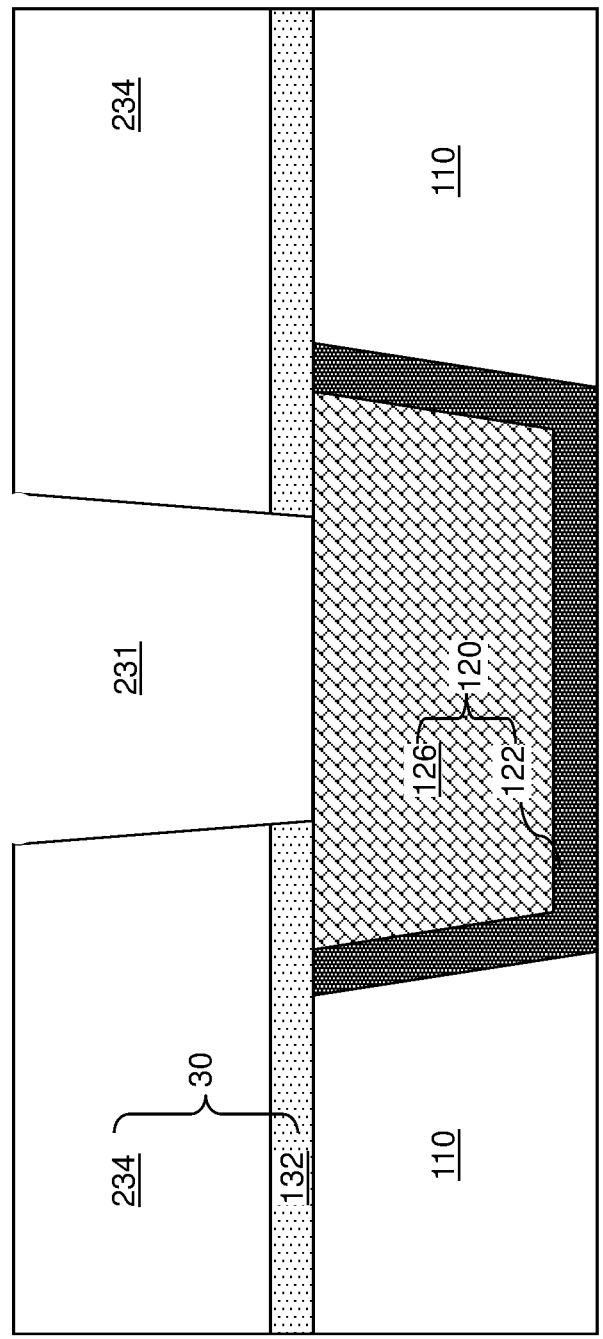
FIG. 3A is vertical cross-sectional view of a portion of the exemplary structure after formation of an underlying conductive material portion, an etch stop dielectric layer, a via-level dielectric material layer, and a via cavity according to an embodiment of the present disclosure.

Referring to FIG. 3A, a portion of the exemplary structure of FIG. 1 having a second configuration is illustrated during a manufacturing step. The second configuration may be used in lieu of the first configuration illustrated in FIGS. 2A-2F, or may be used in conjunction with the first configuration, for example, at a level that is different from the level in which the first configuration is used.

The illustrated portion of FIG. 3A includes an interconnect-level dielectric layer 30, which may be any via-level portion of an interconnect-level dielectric layers illustrated in FIG. 1. In other words, the illustrated interconnect-level dielectric layer 30 may be a via-level dielectric layer in which metallic via structures may be subsequently formed. The illustrated interconnect-level dielectric layer 30 may include an optional etch stop dielectric layer 132 and a via-level dielectric material layer 234, which is a dielectric material layer formed at a via level. The optional etch stop dielectric layer 132, if present, may have the same material composition as in the first configuration of FIGS. 2A-2F, and may have a thickness in a range from 1 nm to 30 nm, such as from 2 nm to 6 nm, although lesser and greater thicknesses may also be used. The via-level dielectric material layer 234 may have the same material composition as the dielectric material layer 134 in the first configuration of FIGS. 2A-2F, and may have a thickness in a range from 1 nm to 150 nm, such as from 5 nm to 50 nm, although lesser and greater thicknesses may also be used.

An underlying conductive material portion 120 is also illustrated, which underlies the interconnect-level dielectric layer 30. The underlying conductive material portion 120 may be formed within an underlying matrix layer 110. In one embodiment, the underlying conductive material portion 120 may have the same configuration as in FIGS. 2A-2E, or may have the same configuration as shown in FIG. 2F.

Via cavities 231 may be formed though the via-level dielectric material layer 234 and the optional etch stop dielectric layer 132. While only a single via cavity 231 is illustrated in FIG. 3A, it is understood that a plurality of via cavities 231 may be simultaneously formed through the via-level dielectric material layer 234 and the optional etch stop dielectric layer 132.

For example, a first photoresist layer (not shown) may be applied over the top surface of the via-level dielectric material layer 234. The first photoresist layer may be lithographically patterned to form openings having a pattern of via cavities to be subsequently formed through the via-level dielectric material layer 234 and the optional etch stop dielectric layer 132. A first anisotropic etch process may be performed to etch through unmasked regions of the via-level dielectric material layer 234 and the optional etch stop dielectric layer 132. The pattern of the openings in the first photoresist layer is transferred through the via-level dielectric material layer 234 and the optional etch stop dielectric layer 132. The first photoresist layer may be subsequently removed, for example, by ashing. The via cavities 231 may extend through the via-level dielectric material layer 234 and the optional etch stop dielectric layer 132. The various dimensions of each via cavity 231 may be the same as the corresponding dimensions of a via portion of an integrated line and via cavity 131 described above with reference to FIGS. 2A-2F.

Figure 3B:
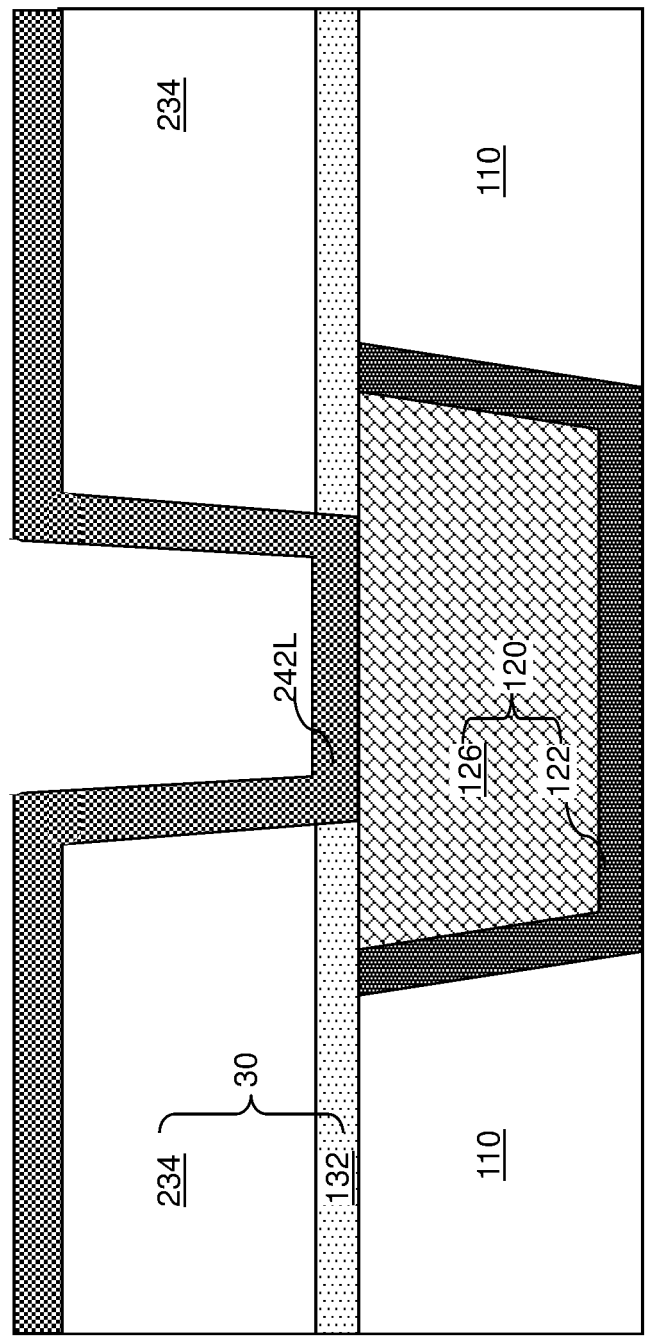
FIG. 3B is vertical cross-sectional view of the portion of the exemplary structure after formation of a via-level graded metallic alloy layer according to an embodiment of the present disclosure.

Referring to FIG. 3B, a first graded metallic alloy layer 242L including a first graded metallic alloy of a respective first metallic material and a respective second metallic material may be deposited on the physically exposed surfaces of each via cavity 231. The thickness and the graded material composition of the first graded metallic alloy layer 242L may be the same as the thickness and the graded material composition of any configuration of the graded metallic alloy layer 142L described above with reference to FIGS. 2A-2F. Further, the first graded metallic alloy layer 242L may be formed by any of the deposition processes that may be used to deposit the graded metallic alloy layer 142L as described above with reference to FIGS. 2A-2F. The first graded metallic alloy layer 242L may be deposited directly on the physically exposed surface of the underlying conductive material portion 120 and directly on all physically exposed surfaces of the via-level dielectric material layer 234 and the optional etch stop dielectric layer 132.

Figure 3C:
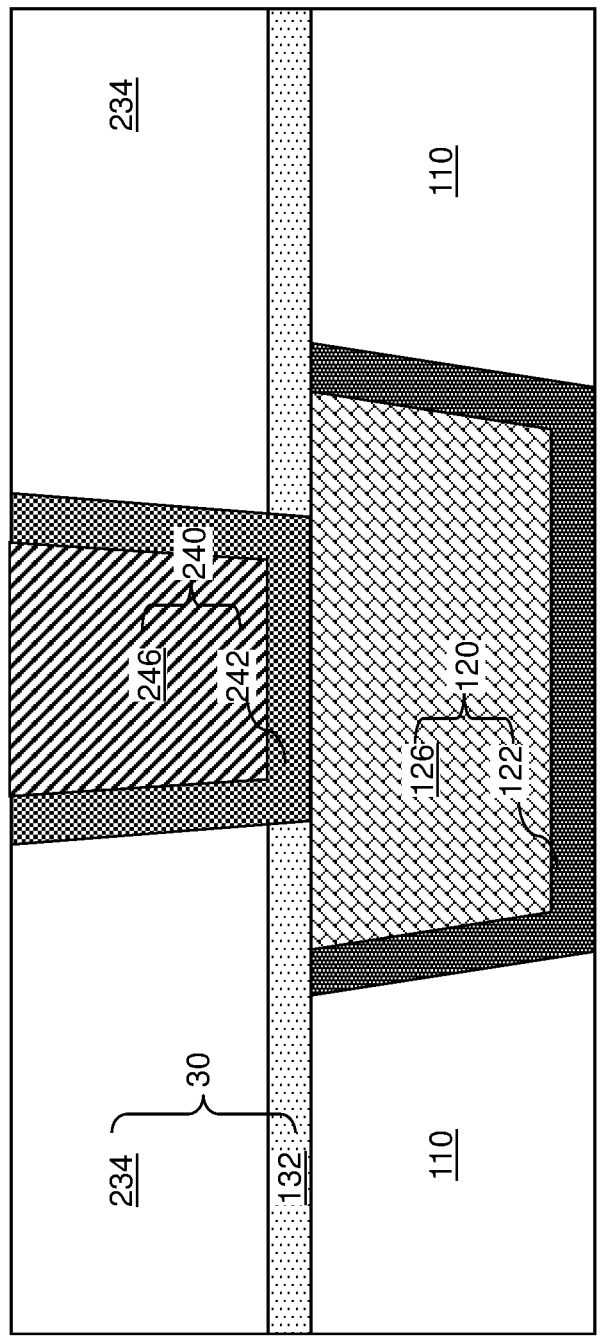
FIG. 3C is vertical cross-sectional view of the portion of the exemplary structure after formation of a metallic via structure according to an embodiment of the present disclosure.

Referring to FIG. 3C, the processing steps of FIG. 2D described above may be performed to deposit a first metallic fill material layer 246. The first metallic fill material layer 246 may have any material composition that may be used for the metallic fill material layer 146L described above, and may be deposited by any method that may be used to deposit the metallic fill material layer 146L. A same process chamber, or a process chamber of a same type, may be employed. In one embodiment, the first graded metallic alloy layer 242L may essentially be free of nitrogen. In one embodiment, the first graded metallic alloy layer 242L may be essentially free of non-metallic elements.

A first planarization process may be performed to remove portions of the first metallic fill material layer 246 and the first graded metallic alloy layer 242L located above the via-level dielectric material layer 234. Specifically, the first planarization process removes portions of the first metallic fill material layer 246 and the first graded metallic alloy layer 242L that are located above the horizontal plane including the top surface of the via-level dielectric material layer 234. The first planarization process may include a first chemical mechanical planarization (CMP) process.

Each set of metallic material portions that fills a via cavity 231 constitutes a metal interconnect structure, which may be a metallic via structure 240. Each metallic via structure 240 may include a first graded metallic alloy layer 242, which is a remaining portion of the first graded metallic alloy layer 242L as formed at the processing steps of FIG. 3B. Further, each metallic via structure 240 may include a remaining portion of the first metallic fill material of the first metallic fill material layer, which is herein referred to as a first metallic fill material portion 246. The first metallic fill material portion 246 contacts an inner sidewall of a vertically-extending portion of the first graded metallic alloy layer 242 within the same metallic via structure 240, and contacts a top surface of a horizontally-extending portion of the first graded metallic alloy layer 242 within the same metallic via structure 240. The top surface of each metallic via structure 240 may be within a same horizontal plane as the top surface of the via-level dielectric material layer 234.

Figure 3D:
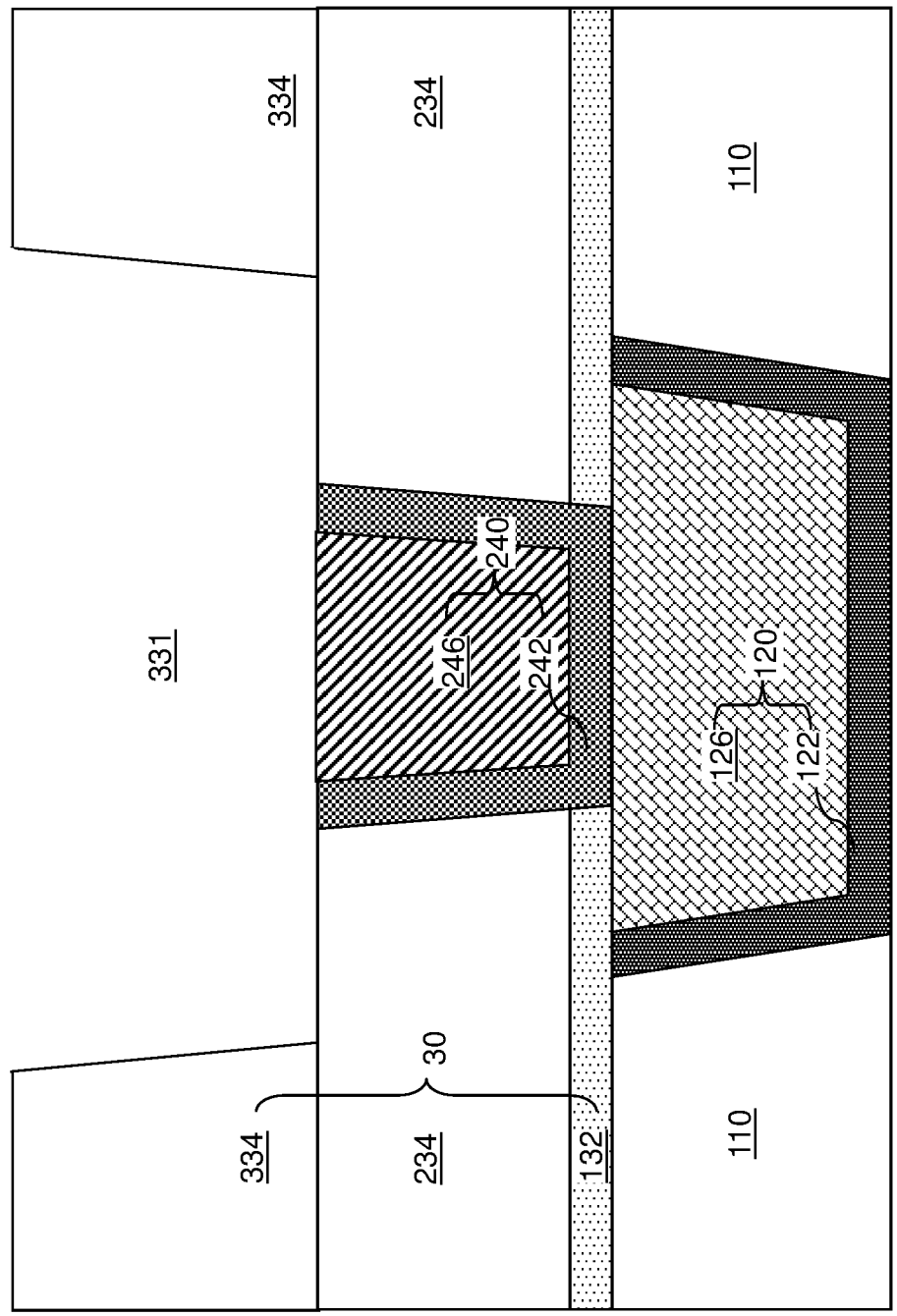
FIG. 3D is vertical cross-sectional view of a portion of the exemplary structure after formation of a line-level dielectric material layer and a line cavity according to an embodiment of the present disclosure.

Referring to FIG. 3D, an additional interconnect-level dielectric layer 30 may be deposited over the via-level dielectric material layer 234. The additional interconnect-level dielectric layer 30 may be a line-level dielectric material layer 334, which may have any material composition that the dielectric material layer 134 described above wither reference to embodiment illustrated in FIGS. 2A-2F may have. The thickness of the line-level dielectric material layer 334 may be in a range from 2 nm to 150 nm, such as from 5 nm to 50 nm, although lesser and greater thicknesses may also be used.

Line cavities 331 may be formed though the line-level dielectric material layer 334. While only a single line cavity 331 is illustrated in FIG. 3D, it is understood that a plurality of line cavities 331 may be simultaneously formed through the line-level dielectric material layer 334.

For example, a second photoresist layer (not shown) may be applied over the top surface of the line-level dielectric material layer 334. The second photoresist layer may be lithographically patterned to form openings having a pattern of line cavities to be subsequently formed through the line-level dielectric material layer 334. A second anisotropic etch process may be performed to etch through unmasked regions of the line-level dielectric material layer 334. The pattern of the openings in the second photoresist layer is transferred through the line-level dielectric material layer 334. The second photoresist layer may be subsequently removed, for example, by ashing. The line cavities 331 extend through the line-level dielectric material layer 334, and a top surface of a metallic via structure 240 may be physically exposed at the bottom of each line cavity 331. The various dimensions of each line cavity 331 may be the same as the corresponding dimensions of a line portion of an integrated line and via cavity 131 described above.

Figure 3E:
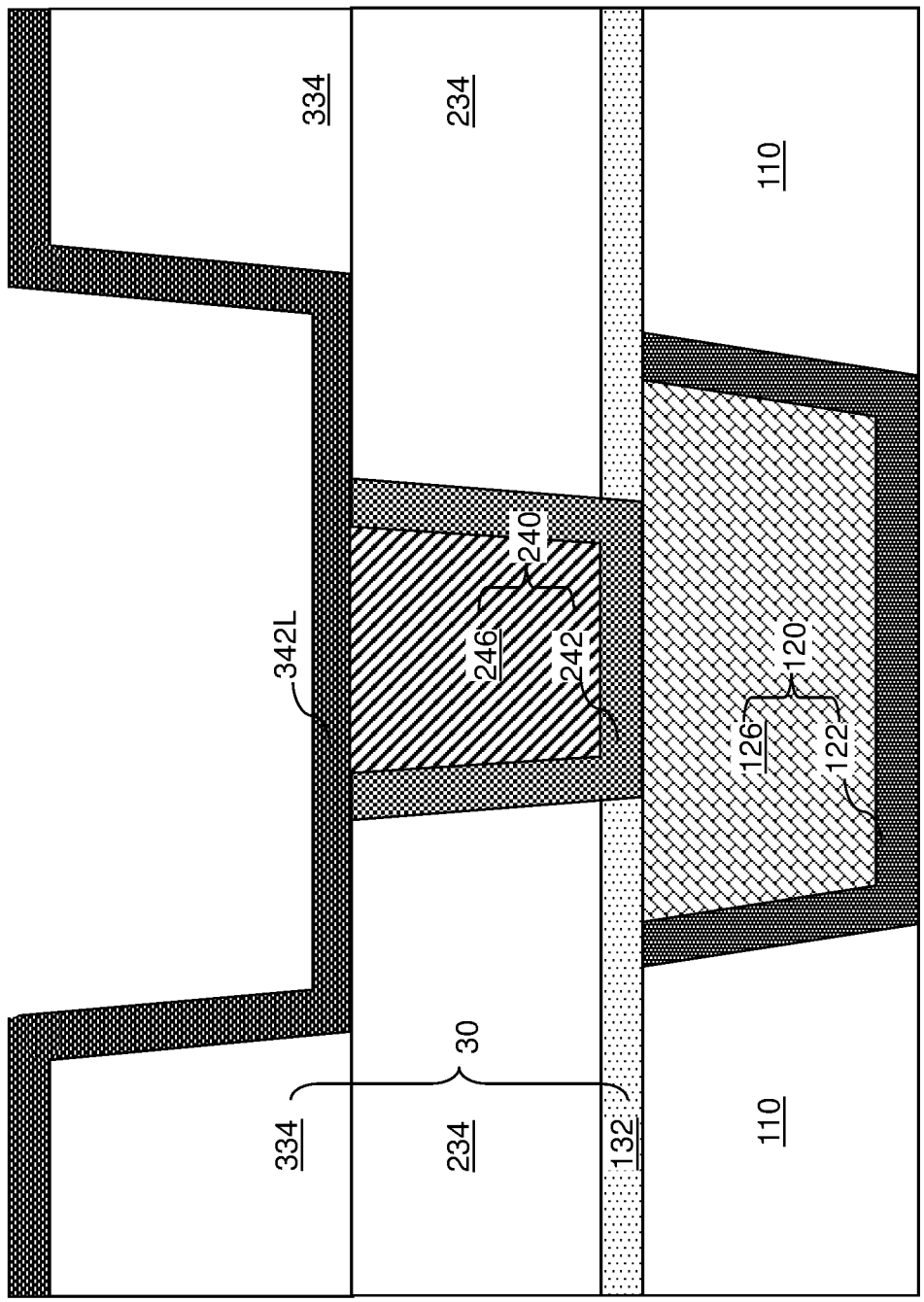
FIG. 3E is vertical cross-sectional view of the portion of the exemplary structure after formation of a line-level graded metallic alloy layer according to an embodiment of the present disclosure.

Referring to FIG. 3E, a second graded metallic alloy layer 342L including a second graded metallic alloy of a respective first metallic material and a respective second metallic material may be deposited on the physically exposed surfaces of each line cavity 331. The thickness and the graded material composition of the second graded metallic alloy layer 342L may be the same as the thickness and the graded material composition of any configuration of the graded metallic alloy layer 142L described above. Thus, the first metallic material of the second graded metallic alloy layer 342L may be any material that may be used as the first metallic material of the graded metallic alloy layer 142L described above. The second metallic material of the second graded metallic alloy layer 342L may be any material that may be used as the second metallic material of the graded metallic alloy layer 142L described above. The first metallic material of the second graded metallic alloy layer 342L may be the same as, or may be different from, the first metallic material of the first graded metallic alloy layer 242L. The second metallic material of the second graded metallic alloy layer 342L may be the same as, or may be different from, the second metallic material of the first graded metallic alloy layer 242L. Further, the second graded metallic alloy layer 342L may be formed by any of the deposition processes that may be used to deposit the graded metallic alloy layer 142L as described above. The second graded metallic alloy layer 342L may be deposited directly on the physically exposed surface of the metallic via structures 240 and directly on all physically exposed surfaces of the line-level dielectric material layer 334.

Figure 3F:
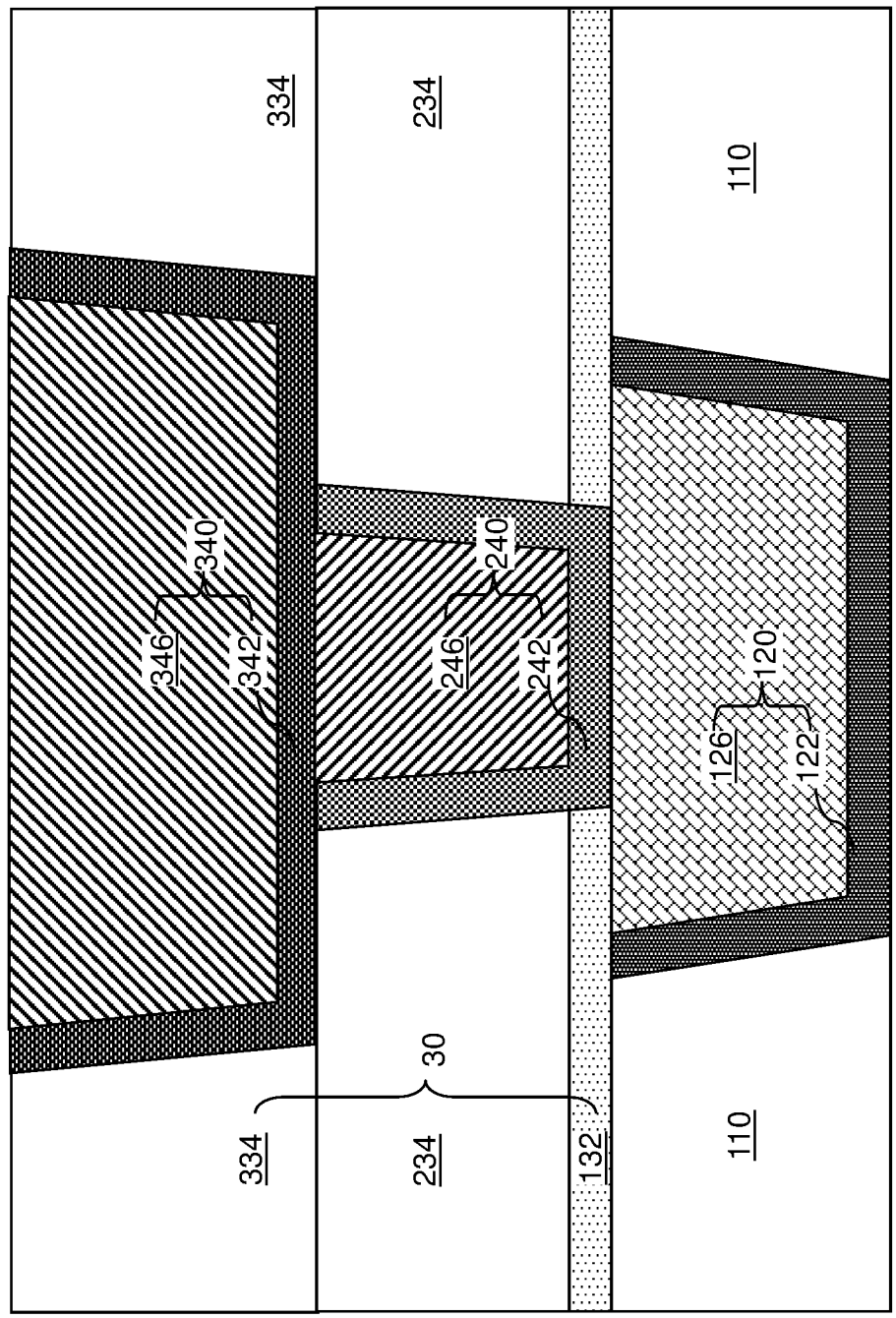
FIG. 3F is vertical cross-sectional view of the portion of the exemplary structure after formation of a metallic line structure according to an embodiment of the present disclosure.

Referring to FIG. 3F, the processing steps of FIG. 2E may be performed again to deposit a second metallic fill material layer. The second metallic fill material layer may have any material composition that may be used for the metallic fill material layer 146L described above, and may be deposited by any method that may be used to deposit the metallic fill material layer 146L.

A second planarization process may be performed to remove portions of the second metallic fill material layer and the second graded metallic alloy layer 342L located above the line-level dielectric material layer 334. Specifically, the second planarization process removes portions of the second metallic fill material layer and the second graded metallic alloy layer 342L that are located above the horizontal plane including the top surface of the line-level dielectric material layer 334. The second planarization process may include a second chemical mechanical planarization (CMP) process.

Each set of metallic material portions that fills a line cavity 331 constitutes a metal interconnect structure, which may be a metallic line structure 340. Each metallic line structure 340 includes a second graded metallic alloy layer 342, which is a remaining portion of the second graded metallic alloy layer 342L as formed at the processing steps of FIG. 3E. Further, each metallic line structure 340 includes a remaining portion of the second metallic fill material of the second metallic fill material layer, which is herein referred to as a second metallic fill material portion 346. The second metallic fill material portion 346 contacts an inner sidewall of a vertically-extending portion of the second graded metallic alloy layer 342 within the same metallic line structure 340, and contacts a top surface of a horizontally-extending portion of the second graded metallic alloy layer 342 within the same metallic line structure 340. The top surface of each metallic line structure 340 may be within a same horizontal plane as the top surface of the line-level dielectric material layer 334.

Each metallic via structure 340 may be used as a metallic via structure illustrated in FIG. 1. Each metallic line structure 240 may be used as metal line or as a metallic bonding pad illustrated in FIG. 1.

Referring to FIG. 4, a diagram illustrates the material composition within a metal interconnect structure (140, 240, 340) according to embodiments of the present disclosure as a function of a distance d from a sidewall of a dielectric material layer (134, 234, 334) that contacts the metal interconnect structure (140, 240, 340). The metal interconnect structure (140, 240, 340) includes a graded metallic alloy layer (142, 242, 342) containing a graded metallic alloy, and a metallic fill material portion (146, 246, 346) including a metallic fill material. The atomic concentration of the first metallic material of the graded metallic alloy layer (142, 242, 342) may strictly decrease as a function of a distance from the interface between the metal interconnect structure (140, 240, 340) and the dielectric material layer (134, 234, 334). The atomic concentration of the second metallic material of the graded metallic alloy layer (142, 242, 342) may strictly increase as a function of a distance from the interface between the metal interconnect structure (140, 240, 340) and the dielectric material layer (134, 234, 334).

Referring collectively to FIGS. 1-4 and according to various embodiments of the present disclosure, a structure is provided, which comprises: an interconnect-level dielectric layer 30 comprising a dielectric material (134, 234, 334) and overlying a substrate 8; and a metal interconnect structure (140, 240, 340) formed within the interconnect-level dielectric layer 30 and including a graded metallic alloy layer (142, 242, 342) and a metallic fill material portion (146, 246, 346), wherein: the graded metallic alloy layer (142, 242, 342) includes a graded metallic alloy of a first metallic material and a second metallic material that is different from the first metallic material; and an atomic concentration of the second metallic material increases with a distance from an interface between the graded metallic alloy and the interconnect-level dielectric layer 30.

In one embodiment, the metallic fill material portion (146, 246, 346) contacts an inner sidewall of a vertically-extending portion of the graded metallic alloy layer (142, 242, 342) and contacts a top surface of a horizontally-extending portion of the graded metallic alloy layer (142, 242, 342). In one embodiment, the graded metallic alloy layer (142, 242, 342) comprises of the first metallic material and the second metallic material. In one embodiment, adhesion strength between the second metallic material and a material of the metallic fill material portion (146, 246, 346) is greater than adhesion strength between the first metallic material and the material of the metallic fill material portion (146, 246, 346), and the first metallic material provides greater diffusion blocking property for the material of the metallic fill material portion (146, 246, 346) than the second metallic material provides for the material of the metallic fill material portion (146, 246, 346).

In one embodiment, the first metallic material comprises of at least one first elemental metal, and the second metallic material comprise at least one second elemental metal. In one embodiment, each of the at least one first elemental metal is selected from Ta, Ti, Ru, In, Zn, Mn, Zr, W, Mo, Os, Ir, Al, Fe, and Ni, and each of the at least one second elemental metal is selected from Co, Ru, Mn, Zn, Zr, W, Mo, Os, Ir, Al, Fe, and Ni. Other suitable metal materials are within the contemplated scope of disclosure. In one embodiment, the at least one first elemental metal is a first single elemental metal, and the at least one second elemental metal is a second single elemental metal.

In one embodiment, the metallic fill material portion (146, 246, 346) comprise an elemental metal selected from Cu, Co, W, Ru, and Mo, or comprises CoWP. In one embodiment, the graded metallic alloy layer (142, 242, 342) has a thickness in a range from 0.3 nm to 5 nm. The atomic concentration of the second metallic material may be in a range from 5% to 30% at a first surface of the graded metallic alloy layer that contacts the interconnect-level dielectric layer 30. The atomic concentration of the second metallic material may be in a range from 70% to 95% at a second surface of the graded metallic alloy layer (142, 242, 342) that contacts the metallic fill material portion (146, 246, 346). The metal interconnect structure (140, 240, 340) comprises one of a metallic line structure 340, a metallic via structure 240, and an integrated metallic line and via structure 140.

According to another embodiment of the present disclosure, a structure is provided, which comprises: an interconnect-level dielectric layer 30 comprising a dielectric material (134, 234, 334) and overlying a substrate 8; and a metal interconnect structure (140, 240, 340) embedded in the interconnect-level dielectric layer 30 and including a graded metallic alloy layer (142, 242, 342) and a metallic fill material portion (146, 246, 346) embedded in the graded metallic alloy layer (142, 242, 342), wherein the graded metallic alloy layer (142, 242, 342) includes a graded metallic alloy of a first metallic material consisting of at least one first elemental metal and a second metallic material consisting of at least one second elemental metal that is different from the first metallic material, and is essentially free of nitrogen atoms.

In one embodiment, the graded metallic alloy layer (142, 242, 342) comprises the graded metallic alloy of the first metallic material and the second metallic material, and an atomic concentration of the second metallic material increases with a distance from an interface between the graded metallic alloy and the interconnect-level dielectric layer 30.

Figure 5:
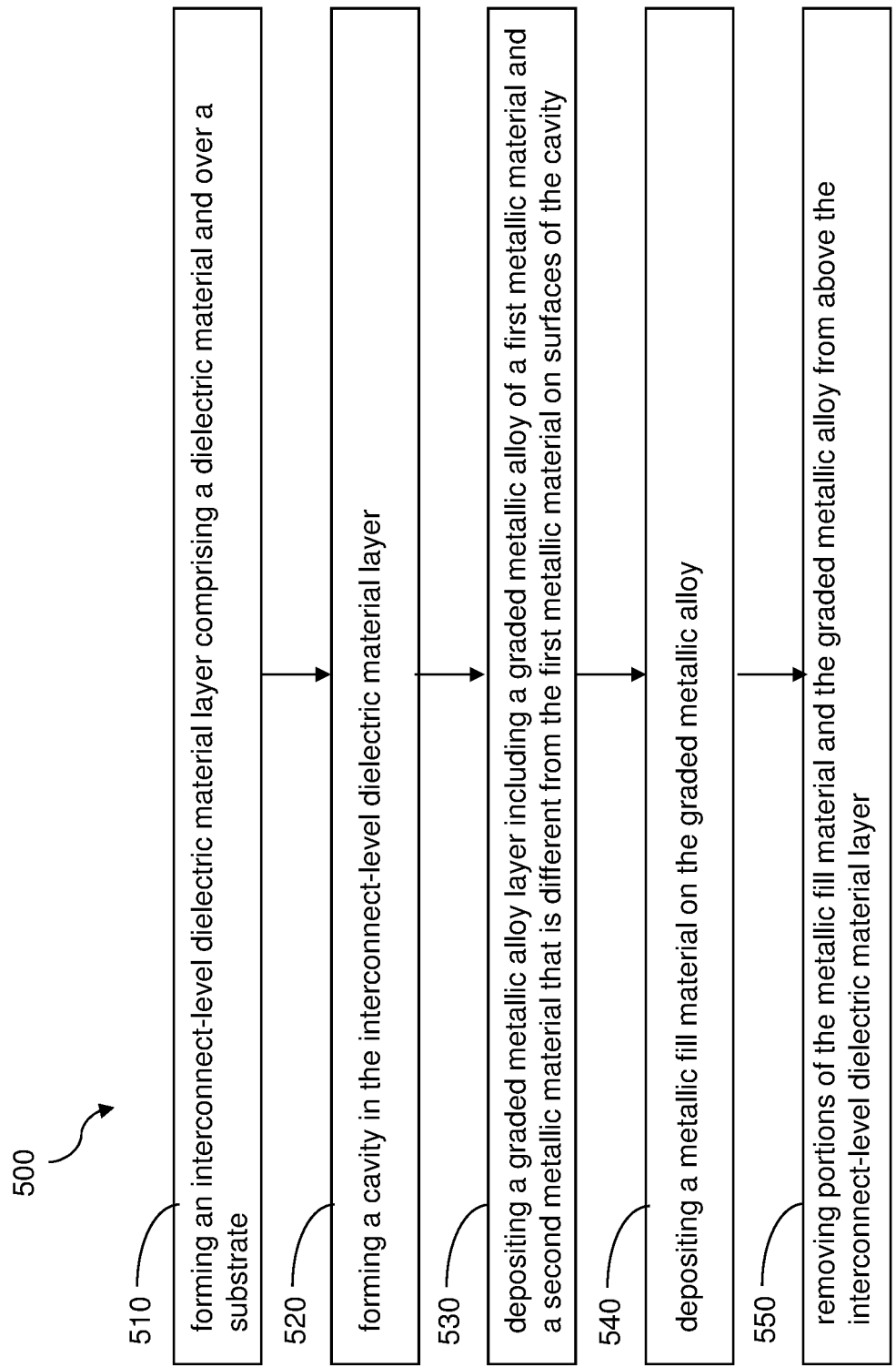
FIG. 5 is a flowchart that illustrates the general processing steps of methods of the present disclosure.

Referring to FIG. 5, a flowchart 500 illustrates the general processing steps of methods of the present disclosure. Referring to step 510, an interconnect-level dielectric layer 30 comprising a dielectric material is formed over a substrate 8. Referring to step 520, a cavity (131, 231, 331) may be formed in the interconnect-level dielectric layer 30. Referring to step 530, a graded metallic alloy layer (142, 242, 342) including a graded metallic alloy of a first metallic material and a second metallic material that is different from the first metallic material may be deposited on surfaces of the cavity (131, 231, 331). An atomic concentration of the second metallic material may increase with a distance within the graded metallic alloy from an interface between the graded metallic alloy and the interconnect-level dielectric layer 30. Referring to step 540, a metallic fill material may be deposited on the graded metallic alloy. Referring to step 550, portions of the metallic fill material and the graded metallic alloy may be removed from above the interconnect-level dielectric layer 30. A metal interconnect structure (140, 240, 340) including remaining portions of the metallic fill material (such as a metallic fill material portion (146, 246, 346)) and remaining portions of the graded metallic alloy (such as a graded metallic alloy layer (142, 242, 342)) may be formed in the cavity (131, 231, 331).

The metal interconnect structures (140, 240, 340) of embodiments of the present disclosure may provide higher electrical conductivity than prior art metal interconnect structures having a same shape and a same total volume. The lower resistance provided by the metal interconnect structures of the present disclosure may be advantageously used in semiconductor dies to reduce voltage drop across metal interconnect structures, and to reduce RC delay in metal wiring structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
an interconnect-level dielectric layer comprising a dielectric material and overlying a substrate; and
a metal interconnect structure embedded in the interconnect-level dielectric layer and including a graded metallic alloy layer and a metallic fill material portion,
wherein:
the graded metallic alloy layer includes a graded metallic alloy consisting essentially of a binary alloy of a first elemental metal and a second elemental metal that is different from the first elemental metal and is different from any element within the metallic fill material portion; and
an atomic concentration of the second elemental metal increases with a distance from an interface between the graded metallic alloy and the interconnect-level dielectric layer, and is non-zero at the interface between the graded metallic alloy and the interconnect-level dielectric layer.

2. The structure of claim 1, wherein the metallic fill material portion contacts an inner sidewall of a vertically-extending portion of the graded metallic alloy layer and contacts a top surface of a horizontally-extending portion of the graded metallic alloy layer.

3. The structure of claim 1, wherein:
adhesion strength between the second elemental metal and a material of the metallic fill material portion is greater than adhesion strength between the first elemental metal and the material of the metallic fill material portion; and
the first elemental metal provides greater diffusion blocking property for the material of the metallic fill material portion than the second elemental metal provides for the material of the metallic fill material portion.

4. The structure of claim 1, wherein the metallic fill material portion comprises an elemental metal selected from Cu, Co, W, Ru, and Mo, or comprises a compound including Co, W, and P.

5. The structure of claim 1, wherein:
the graded metallic alloy layer has a thickness in a range from 0.3 nm to 5 nm;
the atomic concentration of the second elemental metal is in a range from 5% to 30% at a first surface of the graded metallic alloy layer that contacts the interconnect-level dielectric layer; and
the atomic concentration of the second elemental metal is in a range from 70% to 95% at a second surface of the graded metallic alloy layer that contacts the metallic fill material portion.

6. The structure of claim 1, wherein the metal interconnect structure comprises one of a metallic line structure, a metallic via structure, and an integrated metallic line and via structure.

7. The structure of claim 1, wherein:
the first elemental metal is selected from Ta, Ti, Ru, In, Zn, Mn, Zr, W, Mo, Os, Ir, Al, Fe, and Ni; and
the second elemental metal is selected from Co, Ru, Mn, Zn, Zr, W, Mo, Os, Jr, Al, Fe, and Ni.

8. The structure of claim 1, wherein:
the first elemental metal is selected from Ru, In, Zn, Mn, Zr, Mo, Os, Jr, Al, Fe, and Ni; and
the second elemental metal is selected from Co, Ru, Mn, Zn, Zr, Mo, Os, Jr, Al, Fe, and Ni.

9. The structure of claim 1, wherein the graded metallic alloy being free of nitrogen, oxygen, and carbon.

10. A structure comprising:
an interconnect-level dielectric layer comprising a dielectric material and overlying a substrate; and
a metal interconnect structure embedded in the interconnect-level dielectric layer and including a graded metallic alloy layer and a metallic fill material portion embedded in the graded metallic alloy layer, wherein:
the graded metallic alloy layer includes a graded metallic alloy consisting essentially of a binary alloy of a first elemental metal and a second elemental metal that is different from the first elemental metal and is different from any element within the metallic fill material portion; and
an atomic concentration of the second elemental increases with a distance from an interface between the graded metallic alloy and the interconnect-level dielectric layer, and is non-zero at the interface between the graded metallic alloy and the interconnect-level dielectric layer.

11. The structure of claim 10, wherein:
the first elemental metal is selected from Ta, Ti, Ru, In, Zn, Mn, Zr, W, Mo, Os, Ir, Al, Fe, and Ni; and
the second elemental metal is selected from Co, Ru, Mn, Zn, Zr, W, Mo, Os, Ir, Al, Fe, and Ni.

12. The structure of claim 10, wherein the graded metallic alloy being free of nitrogen, oxygen, and carbon.

13. A method of forming a structure, comprising:
forming an interconnect-level dielectric layer comprising a dielectric material over a substrate;
forming a cavity in the interconnect-level dielectric layer;
depositing a graded metallic alloy layer including a graded metallic alloy of a first metallic material and a second metallic material that is different from the first metallic material on surfaces of the cavity, wherein an atomic concentration of the second metallic material increases with a distance within the graded metallic alloy from an interface between the graded metallic alloy and the interconnect-level dielectric layer;
depositing a metallic fill material on the graded metallic alloy; and
removing portions of the metallic fill material and the graded metallic alloy from above the interconnect-level dielectric layer, wherein a metal interconnect structure including remaining portions of the metallic fill material and the graded metallic alloy is formed in the cavity, wherein:
the graded metallic alloy is deposited by a method that is selected from a first deposition method, a second deposition method, a third deposition method, a fourth deposition method, and a fifth deposition method;
the first deposition method comprises simultaneous physical vapor deposition of the first metallic material and the second metallic material with an increase over time of a sputter rate of the second metallic material or a decrease over time of a sputter rate of the first metallic material;
the second deposition method comprises cyclical physical vapor deposition of the first metallic material and the second metallic material within an increase over time of a duration of a sputter time per cycle for the second metallic material or a decrease over time of a duration of a sputter time per cycle for the first metallic material;
the third deposition method comprises simultaneous chemical vapor deposition or simultaneous atomic layer deposition of the first metallic material and the second metallic material with an increase over time of a deposition rate of the second metallic material or a decrease over time of a deposition rate of the first metallic material;
the fourth deposition method comprises cyclical chemical vapor deposition or cyclical atomic layer deposition of the first metallic material and the second metallic material with an increase over time of a duration of a deposition time per cycle for the second metallic material or a decrease over time of a duration of a deposition time per cycle for the first metallic material; and
the fifth deposition method comprises cyclical electrochemical deposition or cyclical electroless deposition of the first metallic material and the second metallic material with an increase over time of a duration of a deposition time per cycle for the second metallic material or a decrease over time of a duration of a deposition time per cycle for the first metallic material.

14. The method of claim 13, wherein the graded metallic alloy is deposited by the first deposition method or by the second deposition method.

15. The method of claim 13, wherein the graded metallic alloy is deposited by the third deposition method or the by the fourth deposition method.

16. The method of claim 13, wherein the graded metallic alloy is deposited by the fifth deposition method.

17. The method of claim 13, wherein:
the first metallic material comprises at least one first elemental metal; and
the second metallic material comprises at least one second elemental metal.

18. The method of claim 17, wherein:
each of the at least one first elemental metal is selected from Ta, Ti, Ru, In, Zn, Mn, Zr, W, Mo, Os, Jr, Al, Fe, and Ni;
each of the at least one second elemental metal is selected from Co, Ru, Mn, Zn, Zr, W, Mo, Os, Jr, Al, Fe, and Ni; and
the metallic fill material comprises an elemental metal selected from Cu, Co, W, Ru, and Mo or comprises a compound including Co, W, and P.

19. The method of claim 13, wherein:
the graded metallic alloy layer has a thickness in a range from 0.3 nm to 5 nm;
the atomic concentration of the second metallic material is in a range from 5% to 30% at a first surface of the graded metallic alloy layer that contacts the interconnect-level dielectric layer; and
the atomic concentration of the second metallic material is in a range from 70% to 95% at a second surface of the graded metallic alloy layer that contacts a remaining portion of the metallic fill material.

20. The method of claim 13, wherein:
the cavity comprises a line cavity, a via cavity, or an integrated line and via cavity; and
the metal interconnect structure comprises one of a metallic line structure, a metallic via structure, and an integrated metallic line and via structure.

\* \* \* \* \*